US012690616B2

(12) United States Patent
Wang

(10) Patent No.: US 12,690,616 B2
(45) Date of Patent: Jul. 28, 2026

(54) AEROSOL GENERATING DEVICE

(71) Applicant: YIBLA (USA) TECHNOLOGY CO. LTD, City of Industry, CA (US)

(72) Inventor: Guangrui Wang, Shenzhen (CN)

(73) Assignee: YIBLA (USA) TECHNOLOGY CO. LTD, City of Industry, CA (US)

( * ) Notice: Subject to any disclaimer, the term of this patent is extended or adjusted under 35 U.S.C. 154(b) by 0 days.

(21) Appl. No.: 19/285,820

(22) Filed: Jul. 30, 2025

(65) Prior Publication Data

US 2026/0090582 A1 Apr. 2, 2026

(30) Foreign Application Priority Data

Sep. 29, 2024 (CN) .......................... 202422395924.8
Jan. 11, 2025 (CN) .......................... 202520062054.4

(51) Int. Cl.
| | |
|---|---|
| *A24F 40/42* | (2020.01) |
| *A24F 40/10* | (2020.01) |
| *A24F 40/95* | (2020.01) |
| *G02F 1/1333* | (2006.01) |
| *H10K 77/10* | (2023.01) |
| *H10K 102/00* | (2023.01) |

(52) U.S. Cl.
CPC .............. *A24F 40/42* (2020.01); *A24F 40/10* (2020.01); *A24F 40/95* (2020.01); *G02F 1/133305* (2013.01); *H10K 77/111* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 2017/0251724 A1 | 9/2017 | Lamb et al. | |
| 2020/0260780 A1 | 8/2020 | Bessant | |
| 2022/0022553 A1 | 1/2022 | Uhrmeister et al. | |

FOREIGN PATENT DOCUMENTS

| | | | | |
|---|---|---|---|---|
| CN | 219982141 U | * | 11/2023 | |
| CN | 220274954 U | | 1/2024 | |
| CN | 118266659 A | * | 7/2024 | .............. A24F 7/00 |
| CN | 221769363 U | * | 9/2024 | |
| CN | 118902184 A | | 11/2024 | |
| WO | WO-2022269700 A1 | * | 12/2022 | ............. A24F 40/50 |

OTHER PUBLICATIONS

WO-2022269700-A1 Description English Translation obtained from Espacenet, pp. 1-55 (Year: 2025).*
CN-118266659-A Description English Translation obtained from Espacenet, pp. 1-63 (Year: 2025).*
CN-221769363-U Description English Translation obtained from Espacenet, pp. 1-24 (Year: 2025).*
CN-219982141-U Description English Translation obtained from Espacenet, pp. 1-47 (Year: 2025).*

* cited by examiner

*Primary Examiner* — Philip Y Louie
*Assistant Examiner* — Virginia R Bieger
(74) *Attorney, Agent, or Firm* — Getech Law LLC; Jun Ye

(57) ABSTRACT

Disclosed is an aerosol generating device, which includes a housing, a first display component, and a second display component. At least part of the first display component and at least part of the second display component are provided at the same side of the housing, and a resolution of the first display component is different from that of the second display component.

27 Claims, 21 Drawing Sheets

A-A

AEROSOL GENERATING DEVICE

CROSS-REFERENCE TO RELATED APPLICATIONS

The present disclosure claims the priority of Chinese Patent Application No. 202422395924.8 filed on Sep. 29, 2024, entitled "Aerosol Generating Device", and Chinese Patent Application No. 202520062054.4 filed on Jan. 11, 2025, entitled "An Aerosol Generating Device". The entire contents of these applications are incorporated herein by reference.

TECHNICAL FIELD

The present disclosure relates to the technical field of electronic vaporization, and more particularly, to an aerosol generating device.

BACKGROUND

An aerosol generating device is an electronic device that can vaporize aerosol-forming substances such as e-liquid or liquid medicine stored in it into aerosols through electro-thermal means. The aerosol-forming substances are also called aerosol-generating substrates.

SUMMARY

Implementations of the present disclosure provides an aerosol generating device that can display rich displays at a low cost.

The present disclosure features an aerosol generating device, which includes a housing, a first display component, and a second display component. At least part of the first display component and at least part of the second display component are provided the same side of the housing, and a resolution of the first display component is different from a resolution of the second display component.

In some implementations, the housing includes an outer casing and a fixing member; the outer casing is provided with a first light-transmitting area and a display window; the fixing member is provided inside the outer casing; the first display component is installed at an outer surface of the fixing member, and at least part of the first display component corresponds to a position of the display window; and the second display component is provided inside the outer casing, and at least part of the second display component corresponds to a position of the first light-transmitting area.

In some implementations, the first display component is provided with a display matching notch, and a position of the display matching notch corresponds to the position of the first light-transmitting area.

In some implementations, the first display component is a bendable flexible display component, and the flexible display component is wrapped around a side of the fixing member.

In some implementations, the first display component includes a flexible printed circuit board with circuit track, a plurality of light-emitting elements, and a flexible display layer; the flexible printed circuit board is provided with a first surface and a second surface disposed opposite to the first surface along a thickness direction of the flexible printed circuit board; the second surface of the flexible printed circuit board is wrapped around the side of the fixing member; the light-emitting elements are provided at intervals on the first surface and electrically connected to the circuit track; the flexible display layer is fixedly laminated on the first surface and covers each light-emitting element; the flexible display layer is provided with a plurality of second light-transmitting areas, each of the second light-transmitting areas is opposite to at least one light-emitting element, and areas of the flexible display layer other than the second light-transmitting areas are light-shielding areas; and a position of the flexible display layer corresponds to the position of the display window.

In some implementations, the outer casing includes a top cover, a bottom cover, and a side cover, and the fixing member is provided between the top cover and the bottom cover; a first end of the fixing member is connected to the top cover; a first end of the side cover is connected to the top cover, and a second end of the side cover is connected to the bottom cover; and the first light-transmitting area is located on the side cover.

In some implementations, the outer casing includes a top cover, a bottom cover, and a side cover, and the fixing member is provided between the top cover and the bottom cover; a second end of the fixing member is connected to the bottom cover; a first end of the side cover is connected to the top cover, and a second end of the side cover is connected to the bottom cover; and the first light-transmitting area is located on the side cover.

In some implementations, the aerosol generating device further including a supporting seat provided between the fixing member and the bottom cover, where the supporting seat is connected to the second end of the fixing member, and the top cover, bottom cover, and side cover are integrally formed.

In some implementations, the aerosol generating device further including a liquid storage component; where the liquid storage component includes a liquid storage tube, a first elastic sealing seat, and a second elastic sealing seat; the fixing member is a fixing tube provided with a tube body portion, one end of the tube body portion facing the top cover is configured to extend in a direction of a central axis of the tube body to form an end wall portion, and the end wall portion abuts against the top cover; and the liquid storage tube is provided inside the tube body portion, the first elastic sealing seat is provided at a first end of the tube body portion and elastically abuts against the end wall portion, and the second elastic sealing seat is provided at a second end of the tube body portion and connected to the supporting seat.

In some implementations, the fixing member is a fixing tube, and the first display component is installed at a side of the fixing tube.

In some implementations, the side of the fixing tube is provided with a fixing groove, and at least part of the first display component is inserted into the fixing groove.

In some implementations, a side wall of the fixing tube is provided with a accommodating hole, the accommodating hole corresponds to the position of the first light-transmitting area, and the second display component is at least partially provided in the accommodating hole.

In some implementations, the aerosol generating device further including a light-transmitting protective cover provided at the display window and connected to the outer casing.

In some implementations, the display window is configured to pass through a first side, a second side, and a third side of the outer casing, the first side of the outer casing is opposite to the third side of the outer casing, and the second side of the outer casing is connected to the first side and the third side.

In some implementations, the resolution of the second display component is higher than the resolution of the first display component.

In some implementations, the first display component is wrapped around an outer surface of the housing, and one end of the first display component is provided at the same side of the housing as the second display component.

In some implementations, one end of the first display component and the second display component are provided at the same side of the aerosol generating device.

In some implementations, the first display component is provided with a display matching notch, and at least part of the second display component is opposite to the display matching notch.

In some implementations, the second display component is configured to extend into the display matching notch.

In some implementations, a first display displayed by the first display component and a second display displayed by the second display component are combined to form an overall display.

In some implementations, the first display component is a bendable flexible display component and is wrapped around the housing along a circumferential direction of the housing, and the second display component is a liquid crystal display screen or an organic light emitting diode display screen.

In some implementations, the aerosol generating device further including a liquid storage component, a vaporizer core, and a battery; where the housing includes a first accommodating shell and a second accommodating shell detachably connected to the first accommodating shell; the liquid storage component and the vaporizer core are both provided inside the first accommodating shell; the battery is provided inside the second accommodating shell and is configured to supply power to the vaporizer core; the first display component and the second display component are both installed at the second accommodating shell, and at least part of the first display component and at least part of the second display component are provided at the same side of the second accommodating shell.

In some implementations, a side wall of the first accommodating shell is provided with an avoidance groove, the avoidance groove includes a first notch and a second notch, and an orientation of the first notch is different from an orientation of the second notch; a side wall of the second accommodating shell is provided with a mounting protrusion, and the mounting protrusion is configured to extend into the avoidance groove through the second notch; and at least part of the second display component is provided at the mounting protrusion, and an orientation of a display surface of the second display component is the same as the orientation of the first notch.

In some implementations, the side wall of the first accommodating shell is further provided with a first docking portion, the side wall of the second accommodating shell is further provided with a second docking portion, and the first docking portion is plug-connected with the second docking portion.

In some implementations, the aerosol generating device further including a first electrode and a second electrode; where the first docking portion includes a docking groove, the first electrode is at least partially provided in the docking groove and electrically connected to the vaporizer core; the second docking portion includes a docking protrusion, the docking protrusion is inserted in the docking groove, and the second electrode is at least partially provided in the docking protrusion and electrically connected to the battery; and the second electrode is configured to abut against the first electrode, and the orientation of the second notch is the same as an orientation of a notch of the docking groove.

In some implementations, the first accommodating shell and the second accommodating shell are provided in parallel.

In some implementations, the first accommodating shell includes a first accommodating portion and a first covering portion, and the first accommodating portion is provided with a first accommodating cavity; a first cavity opening is provided at a side wall of the first accommodating cavity, and the first covering portion is covered at the first cavity opening; the liquid storage component is provided in the first accommodating cavity, and the vaporizer core is provided in the liquid storage component; the second accommodating shell includes a second accommodating portion and a second covering portion, and the second accommodating portion is provided with a second accommodating cavity; a second cavity opening is provided at a side wall of the second accommodating cavity, and the second covering portion is covered at the second cavity opening and is detachably connected to the first covering portion; and the battery is provided in the second accommodating cavity, the first display component is mounted at the second accommodating portion, and the second display component is mounted at the second covering portion.

The details of one or more implementations of the subject matter of this present disclosure are set forth in the accompanying drawings and the description below. Other features, aspects, and advantages of the subject matter can become apparent from the description, the drawings, and the claims.

BRIEF DESCRIPTION OF DRAWINGS

To illustrate the technical solutions in the embodiments of the present disclosure more clearly, the following provides a brief introduction to the drawings used in the description of the embodiments. Obviously, the drawings described below are only some embodiments of the present disclosure. Without expending creative effort, a person of ordinary skill in the art may obtain other drawings based on the structures shown in these drawings.

Figure 1:
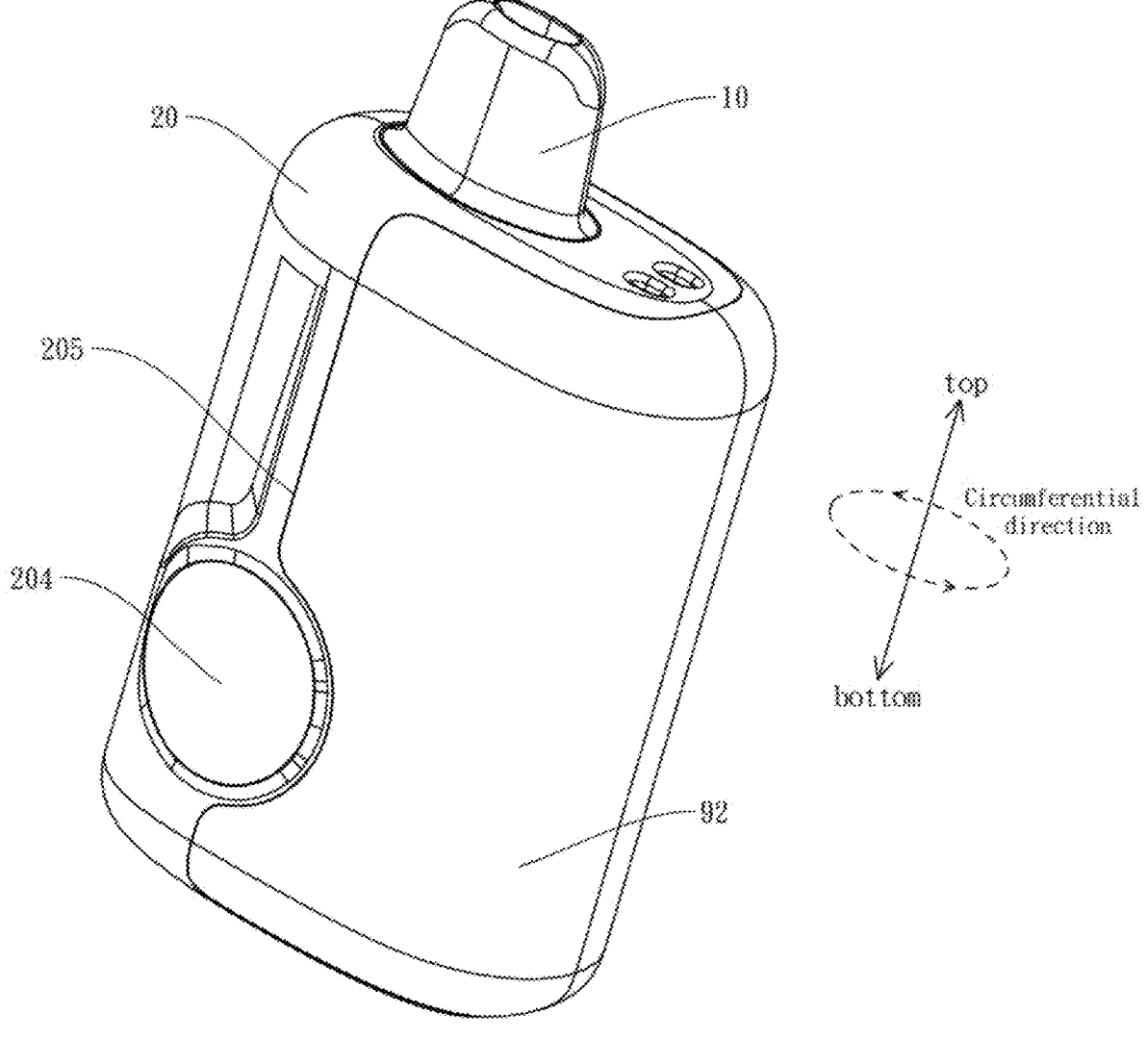
FIG. 1 is a perspective view of an aerosol generating device according to an embodiment of the present disclosure.
Figure 2:
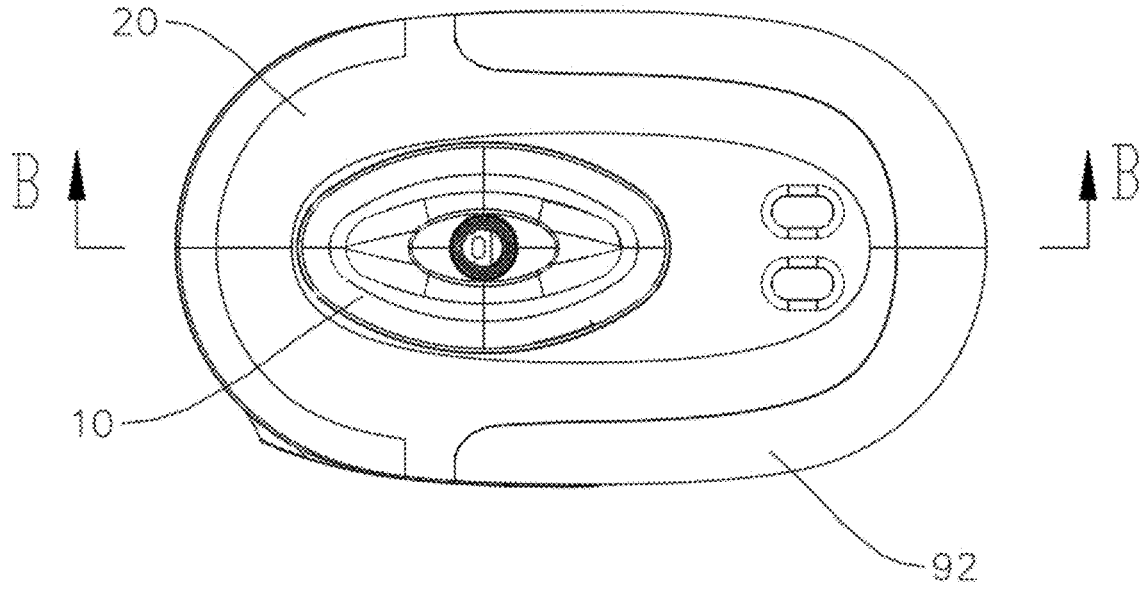
FIG. 2 is a top view of the aerosol generating device according to an embodiment shown in FIG. 1.
Figure 3:
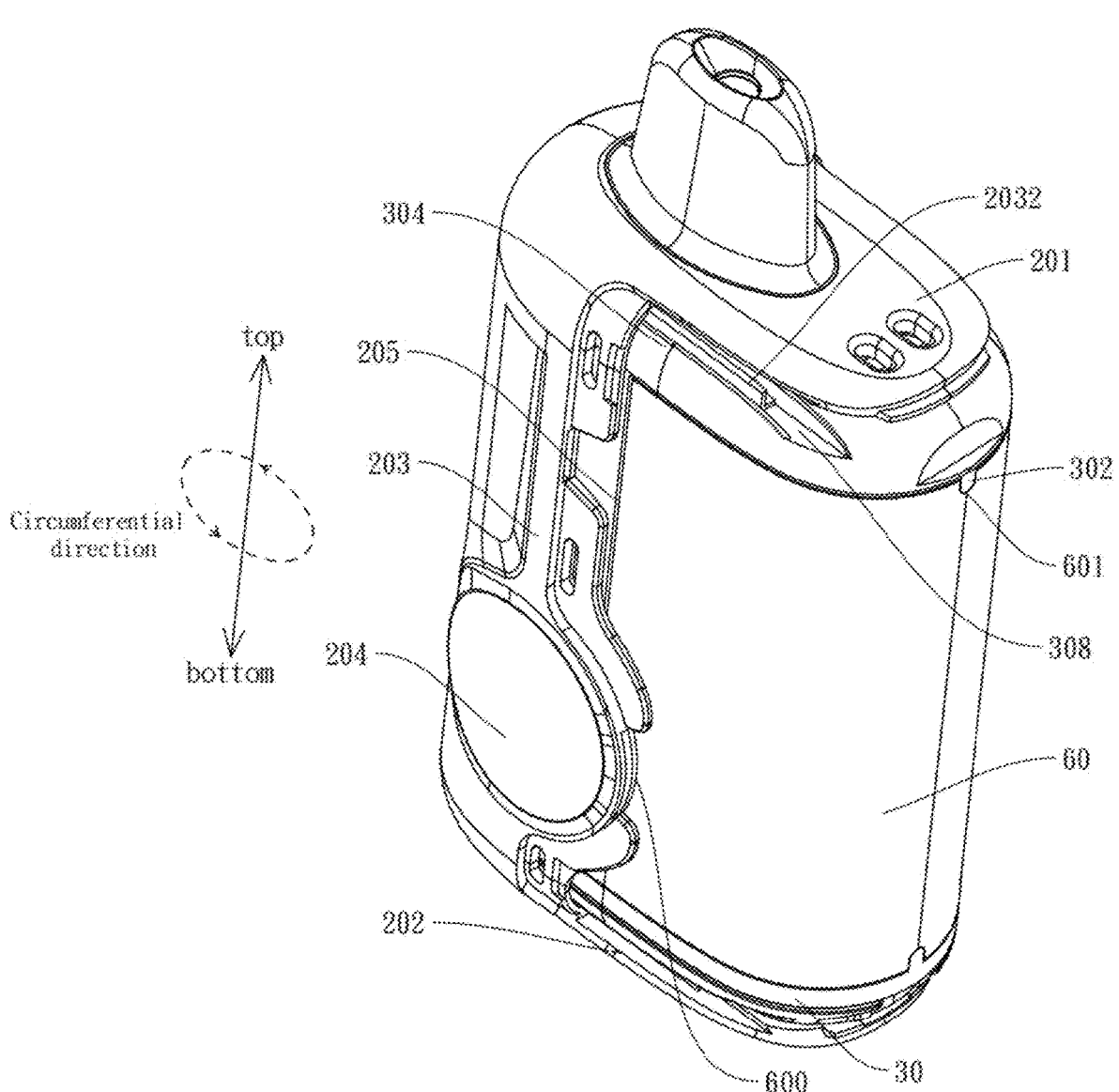
FIG. 3 is a perspective view of the aerosol generating device of FIG. 1 with the light-transmitting protective cover removed.
Figure 4:
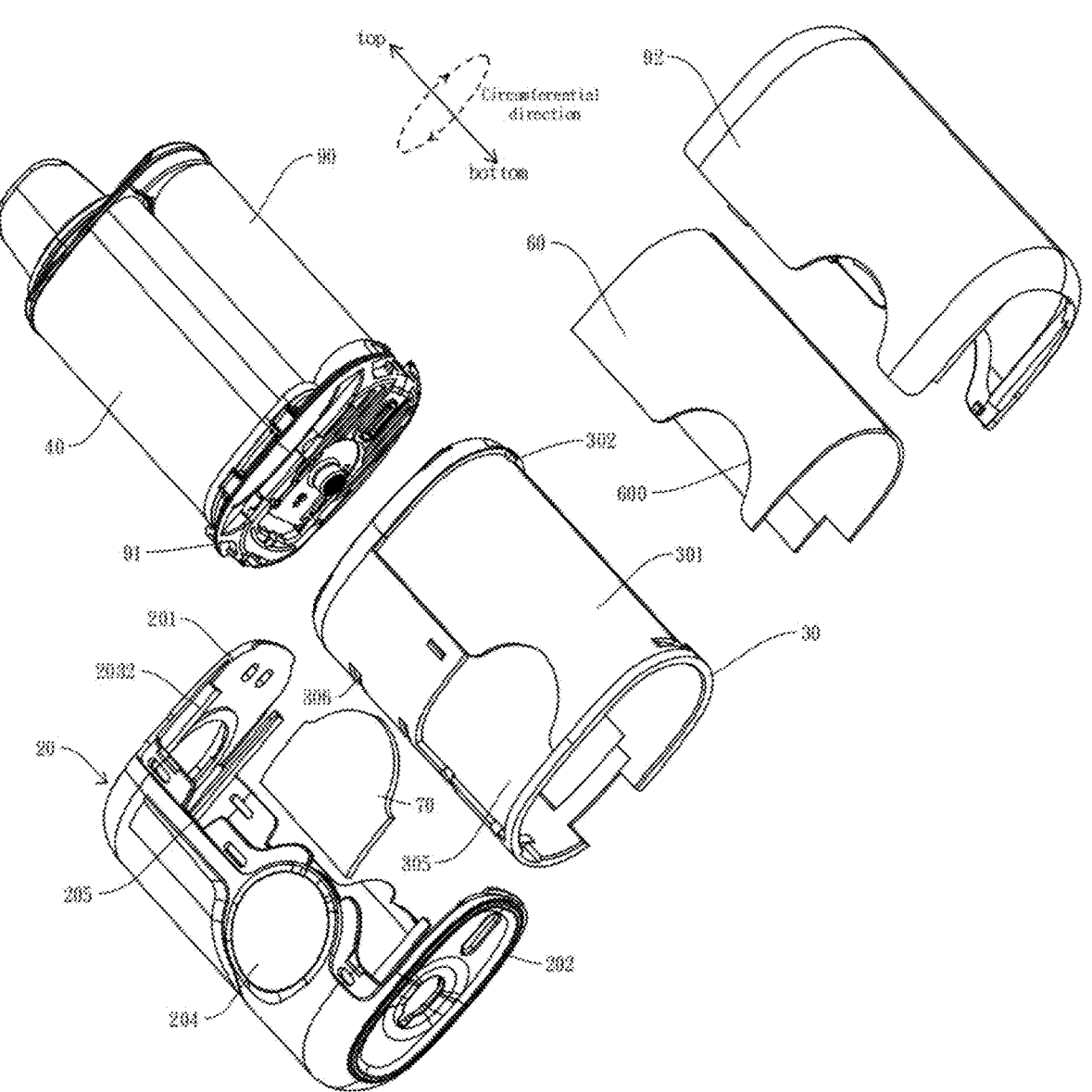
FIG. 4 is an exploded view of the aerosol generating device shown in FIG. 1.
Figure 5:
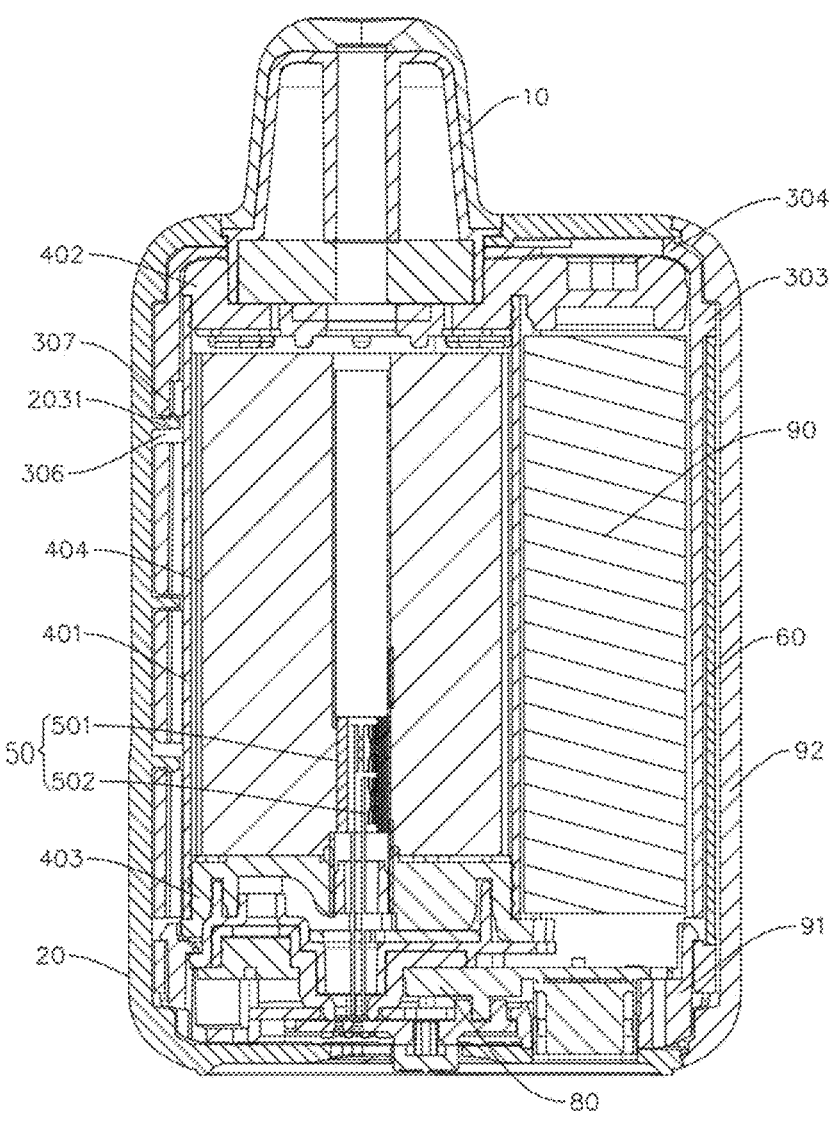
FIG. 5 is a sectional view of FIG. 2 along the B-B direction.

It is to be understood that the various exemplary implementations shown in the figures are merely illustrative representations and are not necessarily drawn to scale. The realization of the purpose of the present disclosure, functional features and advantages can be further described in conjunction with the embodiments and with reference to the accompanying drawings.

DETAILED DESCRIPTION

An aerosol generating device can include a vaporizer core, a power component, and a storage chamber. The storage chamber can contain aerosol-forming substances, which can be transmitted to the vaporizer core through capillary action. When the user uses the aerosol generating device to inhale, the power component provides electrical energy to the vaporizer core, so that the vaporizer core can be powered on and heated. The heat generated by the power supply and heating of the vaporizer core can be used to vaporize the aerosol-forming substance conducted to the vaporizer core into an aerosol that can be inhaled by the user.

With the continuous use of the aerosol generating device, the power supply of the aerosol generating device and the amount of aerosol-forming substances will gradually decrease. In order to facilitate the user to know the remaining power of the aerosol generating device and the remaining amount of aerosol-forming substances at any time and intuitively, the outside of the aerosol generating device can be equipped with a display screen that can display information such as the remaining power and the remaining amount of aerosol-forming substances. In some cases, the overall resolution of the display screen of the aerosol generating device is consistent. For the display screen with a relatively low overall resolution, although its cost is low, it can only display simple displays and fail to provide users with a good visual experience. For the display screen with a relatively high overall resolution, although it can display rich displays and offer users a good visual experience, its cost is high, which is not conducive to promotion and application.

Implementations of the present disclosure provides an aerosol generating device that can display rich displays at a low cost.

The technical solutions in the embodiments of the present disclosure can be clearly and completely described below in conjunction with the accompanying drawings in the embodiments of the present disclosure. Obviously, the described embodiments are only a part of the embodiments of the present disclosure and not all of them. Based on the embodiments in the present disclosure, all other embodiments obtained by a person of ordinary skill in the art without creative labor fall within the scope of protection of the present disclosure.

It is to be noted that if the embodiments of the present disclosure involve directional indications (such as up, down, left, right, front, back, top, bottom . . . ), the directional indication is only used to explain the relative positional relationship between the various parts and the movement in a particular attitude, etc., and if the particular attitude is changed, the directional indication can be changed accordingly. In addition, the use of the term "a" or "an" in the claims and/or the specification may mean "one," as well as "one or more," "at least one," and "one or more than one." As such, the terms "a," "an," and "the," as well as all singular terms, include plural referents unless the context clearly indicates otherwise. Likewise, plural terms shall include the singular unless otherwise required by context.

Furthermore, if the embodiments of the present disclosure contain descriptions involving "first", "second", etc., the descriptions of "first", "second", etc. are used only for descriptive purposes, and are not to be construed as indicating or implying their relative importance or implicitly specifying the number of technical features indicated. As a result, a feature defined as "first" or "second" may include at least one such feature, either explicitly or implicitly.

In addition, if the term "and/or" appears in the whole text (including the claims), the meaning of the term "and/or" includes three parallel solutions, taking "A and/or B" as an example, including an A solution, or a B solution, or a solution that both A and B satisfy. In addition, a large number of technical features are recorded in the specification of the present disclosure and distributed in various technical schemes. If all possible combinations of technical features (i.e. technical schemes) of the present disclosure are listed, the specification will be too lengthy. In order to avoid this problem, various technical features disclosed in the above summary of the present disclosure, various technical features disclosed in the following implementations and implementations, and various technical features disclosed in the drawings can be freely combined with each other to form various new technical schemes (all of which are deemed to have been recorded in this specification), unless such combination of technical features is not technically feasible. For example, feature A+B+C is disclosed in one example, feature A+B+D+E is disclosed in another example. Features C and D are equivalent technical means that play the same role, only one of which is technically necessary to be chosen, and cannot be used at the same time. Feature E may be technically combined with feature C. Then, the scheme of A+B+C+D should not be considered as already recorded because of the technical infeasibility, while the scheme of A+B+C+E should be considered as already recorded.

As shown in FIG. 1 to FIG. 5, the present disclosure provides an aerosol generating device. The aerosol generating device includes a mouthpiece 10, an outer casing 20, a fixing member 30, a liquid storage component 40, a vaporizer core 50, a first display component 60, a second display component 70, a controller 80, and a battery 90. The mouthpiece 10 is connected to the outer casing 20 for users to inhale aerosols. In this embodiment, the outer casing 20 and the fixing member 30 form the housing of the aerosol generating device. That is, the housing includes an outer casing 20 and a fixing member 30. The housing can accommodate and install at least some components of the aerosol generating device, and its specific shape and structure are not limited here.

In this embodiment, the outer casing 20 includes a top cover 201, a bottom cover 202, and a side cover 203. The top cover 201 is connected to the mouthpiece 10. The first end of the side cover 203 is connected to the top cover 201, and the second end of the side cover 203 is connected to the bottom cover 202. The side cover 203 is provided with a first snap-fit portion 2031 and a first guiding portion 2032 extending horizontally along the outer casing 20. Specifically, the first snap-fit portion 2031 is a snap-fit hook, and the first guiding portion 2032 is a guiding arm. In an embodiment, the side cover 203 can be omitted, and the fixing member 30 is directly connected to the top cover 201 and the bottom cover 202.

The side cover 203 is also provided with a disc-shaped first light-transmitting area 204 located on the first side of the outer casing 20. The first light-transmitting area 204 can be made of transparent or semi-transparent material and can be shaped as needed. The first side of the outer casing 20 is opposite to the third side of the outer casing 20. The top cover 201 and the bottom cover 202 are disposed opposite to each other and are located at two ends of the housing 20 respectively. The top cover 201, the bottom cover 202, and the side cover 203 together form a display window 205 that passes through the first side, second side, and third side of the outer casing 20. The second side of the outer casing 20 is connected to the first side and the third side. In an embodiment, the top cover 201, the bottom cover 202, and the side cover 203 are integrally formed, which not only facilitates assembly and improves production efficiency but also makes the structure more reliable.

The fixing member 30 is located inside the outer casing 20 between the top cover 201 and the bottom cover 202. That is, the fixing member 30 is located in the space formed by the outer casing 20. The fixing member 30 is connected to the top cover 201. The cooperation between the fixing member 30 and the outer casing 20 facilitates the installation of the first display component 60 and the second display component 70, improves production efficiency, and makes the structure more stable and reliable.

In an embodiment, the aerosol generating device further includes a supporting seat 91. The fixing member 30 is a fixing tube, i.e., a tubular structure. The first end of the fixing tube is connected to the top cover 201, and the second end of the fixing tube is connected to the supporting seat 91. The fixing tube is provided with a fixing groove 301 on its side, and the fixing groove 301 has a positioning protrusion 302. The fixing tube is also provided with an accommodating hole 305, an avoidance hole 306, a second snap-fit portion 307, and a second guiding portion 308. The accommodating hole 305 and the avoidance hole 306 are located at the side wall of the fixing tube. The first snap-fit portion 2031 passes through the avoidance hole 306 and is snap-fitted with the second snap-fit portion 307, ensuring a tight connection between the fixing member 30 and the outer casing 20. The first guiding portion 2032 matches with the second guiding portion 308, so that the first snap-fit portion 2031 and the second snap-fit portion 307 can be positioned well, which facilitates assembly and improves production efficiency.

In this embodiment, the second snap-fit portion 307 is the tube wall of the fixing tube, and the second guiding portion 308 is a guiding slot extending horizontally from the fixing tube. The supporting seat 91 is located between the fixing tube and the bottom cover 202. Specifically, the fixing tube has a tube body portion 303, and the fixing groove 301 is located on the side of the tube body portion 303. One end of the tube body portion 303 facing the top cover 201 extends in the direction of the central axis of the tube body portion 303 to form an end wall portion 304. The second guiding portion is located at the end wall portion 304, and the end wall portion 304 abuts the top cover 201, so the overall structure is more reliable. In an embodiment, the supporting seat 91 can be omitted, and the second end of the fixing member 30 is connected to the bottom cover 202. The fixing member 30 can be plate-shaped or open-ring-shaped.

The liquid storage component 40 includes a liquid storage tube 401, a first elastic sealing seat 402, and a second elastic sealing seat 403. The liquid storage tube 401 is located inside the tube body portion 303 and contains a porous liquid-absorbing column 404 for adsorbing aerosol generating substrate. The porous liquid-absorbing column 404 can be a porous foam or fiber, etc., as long as the aerosol generating substrate can be adsorbed. The first elastic sealing seat 402 is covered at the first end of the tube body portion 303 and elastically abuts with the end wall portion 304 to improve sealing performance. The second elastic sealing seat 403 is covered at the second end of the tube body portion 303 and is connected to the supporting seat 91.

The vaporizer core 50 includes a liquid guide portion 501 and an electric heating element 502. The liquid guide portion 501 is located inside the porous liquid-absorbing column 404 and transmits the aerosol generating substrate to the electric heating element 502. The liquid guide portion 501 can be made of materials such as cotton or porous ceramics, as long as it can adsorb aerosol generating substrate. The aerosol generating substrate can be formed by combining propylene glycol, glycerol and flavors in a certain proportion. The aerosol generating substrate is the related art, and its components will not be described here. The electric heating element 502 is electrically connected to the controller 80, which is connected to the battery 90 and controls power supply to the electric heating element 502. The electric heating element 502 can be an electric heating mesh or electric heating wire. The structure of the vaporizer core 50 is not specifically limited here, as long as the aerosol generating substrate can be atomized to form an aerosol.

The first display component 60 and the second display component 70 are installed on the housing, either on the outer surface or inside, and the space formed inside the housing also belongs to the category of the housing. In this embodiment, the first display component 60 is wrapped around the outer surface of the fixing tube. The first display component 60 can be used to display relevant parameter information of the aerosol generating device and patterns such as stars, moon, sun, rockets, etc. that improve the aesthetics of the electronic cigarette, for example, for displaying the remaining power of the aerosol generating device, the remaining amount of aerosol-forming substance, working power, preset pattern information, etc. In this embodiment, the first display component 60 is a bendable flexible display component, that is, a flexible display screen, for example, a flexible organic light-emitting diode (OLED) screen, a flexible liquid crystal display (LCD) screen, etc., and the first display component 60 can be fixed to the outer surface of the fixing tube by pasting, clamping, etc. The first display component 60 may have an O-shaped or U-shaped shape, and its shape is not specifically limited here.

One end of the first display component 60 and the second display component 70 are located on the same side of the housing, that is, one end of the first display component 60 and the second display component 70 are located on the same side of the aerosol generating device, and the display displayed by the second display component 70 and at least part of the display displayed by the first display component 60 are located on the same side of the aerosol generating device. Therefore, the display displayed by the first display component 60 and the display displayed by the second display component 70 can be combined to form an overall display, and the resolution of the first display component 60 is different from the resolution of the second display component 70. Therefore, through the cooperation of the second display component 70 and the first display component 60, it is possible to realize the display of certain images at a low cost.

As long as at least part of the first display component 60 and at least part of the second display component 70 are located on the same side of the housing, that is, at least part of the first display component 60 and at least part of the second display component 70 are located on the same side of the aerosol generating device, the spacing and positional relationship between the two are not specifically limited here. For example, when the housing is a polyhedron, at least part of the display displayed by the first display component 60 and at least part of the display displayed by the second display component 70 are located on the same side of the housing. When the housing is a rotating body, at least part of the display displayed by the first display component 60 and at least part of the display displayed by the second display component 70 are located in the same area of the housing, so that when the user watches, at least part of the display formed by the combination of the first display component 60 and the second display component 70 can be seen. Therefore, as long as the user can see at least part of the display formed by the combination of the first display component 60 and the second display component 70 when watching, it is considered that at least part of the first display component 60 and at least part of the second display component 70 are located on the same side of the housing.

In an embodiment, the second display component 70 has a smaller pixel pitch and higher resolution than the first display component 60, and has better smoothness and detail performance in displaying images. Therefore, the second display component 70 can be used to display images of objects such as the sun or the earth that move rapidly, and the first display component 60 can be used to display images of other planets or satellites that move slowly around the sun or the earth. In this way, not only are the strengths of both the first display component 60 and the second display component 70 fully utilized, but the cost is also effectively reduced. In addition, the first display component 60 and the second display component 70 can be combined to display scenes such as fountains, sprays, and fireworks. The second display component 70 can be a rigid LCD or OLED screen and is inserted into the accommodating hole 305 for reliable placement. Pixel pitch refers to the distance between adjacent pixels on a screen.

The first display component 60 is provided with a display matching notch 600 and a positioning notch 601. The position of the display matching notch 600 corresponds to the position of the first light-transmitting area 204, so the first display component 60 and the second display component 70 match more closely, so that the display displayed by the first display component 60 and the display displayed by the second display component 70 can be better integrated together, thereby improving the display effect. The positioning protrusion 302 is inserted into the positioning notch 601, so it is not easy to move during assembly, which not only facilitates assembly but also improves the yield of the product.

As shown in FIG. 6 to FIG. 9, the first display component 60 in this embodiment is a bendable flexible display component wrapped around the side of the fixing member 30. It includes a flexible printed circuit board 1, multiple light-emitting elements 2, and a flexible display layer 3. The flexible printed circuit board 1 is wrapped around the side of the fixing member 30 (a fixing tube in this case) and inserted into the fixing groove 301, which is not only convenient to assemble, but also easy to assemble in place, thereby improving production efficiency.

The flexible printed circuit board 1 is provided with a circuit track 14 and a first surface 11 along its thickness direction. Multiple light-emitting elements 2 are spaced on the first surface 11 of the flexible printed circuit board 1 and electrically connected to the circuit tracks 14. The flexible display layer 3 is fixedly laminated on the first surface 11 of the flexible printed circuit board 1 and covers each light-emitting element 2. The position of the flexible display layer 3 corresponds to that of the display window 205. The flexible display layer 3 is provided with multiple second light-transmitting areas 31, each opposite at least one light-emitting element 2. The area of the flexible display layer 3 other than the second light-transmitting areas 31 is a light-shielding area 32.

In this embodiment, the flexible printed circuit board 1 (also known as an FPC board) is a flexible circuit board with printed circuit tracks 14, offering flexibility, light weight, and thinness. In a specific manufacturing process, the desired flexible printed circuit board 1 can be obtained by printing a circuit track 14 on a flexible film, where the flexible film can be a polymer material with high performance (such as excellent heat resistance, chemical stability and bendability) such as a polyimide film and a polyester film.

In this embodiment, the light-emitting elements 2 can be LED beads or other electro-luminescent components. In an embodiment, the light-emitting elements 2 can be LED beads with dimensions of 0.5-1.5 mm in length, 0.2-0.8 mm in width, and 0.1-0.8 mm in thickness. In an embodiment, the light-emitting elements 2 can be 0402-sized LED beads (1.0 mm in length, 0.5 mm in width, and 0.4 mm in thickness). Repeated tests have shown that using these LED beads as light-emitting elements 2 in the first display component 60 of this embodiment provides better display effects and higher reliability compared with LED beads of other sizes. The light-emitting elements 2 can be fixed to the first surface 11 of the flexible printed circuit board 1 by soldering, adhesive bonding (using insulating or conductive adhesives), or other suitable methods, and electrically connected to the circuit tracks 14.

In this embodiment, the flexible display layer 3 can be made of flexible materials such as polyimide (PI), polyethylene terephthalate (PET), polyethylene naphthalate (PEN), liquid crystal polymer (LCP), polyvinyl alcohol (PVA), or polydimethylsiloxane (PDMS), as long as it meets the usage requirements. The specific material of the flexible display layer 3 is not limited in this embodiment. When the flexible display layer 3 is made of transparent flexible material, second light-transmitting areas 31 and light-shielding area 32 can be formed by coating with light-shielding ink. For example, if the flexible display layer 3 is a transparent polyimide film, areas coated with light-shielding ink become light-shielding area 32, while uncoated areas become second light-transmitting areas 31. If the flexible display layer 3 is made of opaque flexible material, light-transmitting areas 31 and light-shielding area 32 can be formed by laser engraving. For example, if the flexible display layer 3 is an opaque PET film, second light-transmitting areas 31 (at this time, the second light-transmitting areas 31 is essentially a through hole.) can be created by laser engraving, with the remaining regions becoming light-shielding area 32.

It should be noted that the shape, size, and layout of the second light-transmitting areas 31 can be adjusted according to actual needs, with no specific limitations in this embodiment. In an embodiment, the second light-transmitting areas 31 can take various forms such as text, numbers, letters, dots, or lines. When the light emitted by the light-emitting element 2 reaches the second light-transmitting areas 31, light display information of a corresponding shape can be displayed. For example, when the light emitted by the light-emitting element 2 reaches the second light-transmitting areas 31 in the shape of letters, the user can observe the light-emitting letters on the flexible display layer 3. In this way, by combining a plurality of second light-transmitting areas 31 in different shapes, light display information in a variety of different shapes can be obtained, and light display information in different shapes can be used to represent various information of the aerosol generating device (such as remaining power, working power, remaining amount of aerosol-forming substances, preset pattern, etc.). In addition, the number of light-emitting elements 2 corresponding to each second light-transmitting area 31 can also be determined according to actual use requirements, and this embodiment does not impose specific restrictions on this.

Figure 7:
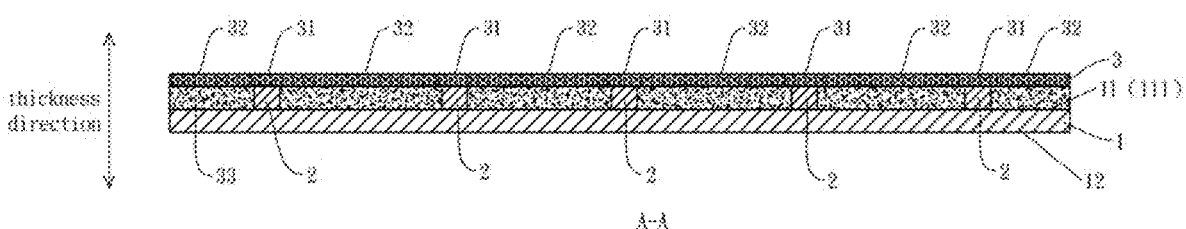
FIG. 7 is a sectional view of FIG. 6 along the A-A direction.

In this embodiment, the flexible display layer 3 can be fixedly laminated on the first surface 11 of the flexible printed circuit board 1 by bonding or other methods. In an embodiment, as shown in FIG. 7, a third adhesive layer 33 is provided on the surface of the flexible display layer 3 facing the flexible printed circuit board 1, and the flexible display layer 3 can be quickly and reliably adhered to the flexible printed circuit board 1 through the third adhesive layer 33 to form an integrated stacked structure. In a specific implementation, the third adhesive layer 33 can be a double-sided adhesive, a structural adhesive, an optically transparent adhesive, a pressure-sensitive adhesive, etc., as long as it can meet the use requirements, and this embodiment does not impose any specific restrictions on this.

In the technical solution provided by the embodiment of the present disclosure, the first surface 11 of the flexible printed circuit board 1 is populated with multiple light-emitting elements 2, and the flexible display layer 3 with multiple second light-transmitting areas 31 is fixed on the first surface 11 of the flexible printed circuit board 1, covering each light-emitting element 2. This encapsulates multiple light-emitting elements 2 between the flexible display layer 3 and the flexible printed circuit board 1. The flexible printed circuit board 1 serves as the mounting carrier for multiple light-emitting elements 2, and the circuit track 14 on the flexible printed circuit board 1 can be used as a medium for electrically connecting multiple light-emitting elements 2 to a power source. When multiple light-emitting elements 2 are connected to the battery through the circuit track 14 of the flexible printed circuit board 1, the light-emitting elements 2 illuminate, and their light is displayed through the second light-transmitting areas 31 of the flexible display layer 3. That is, the second light-transmitting areas 31 of the flexible display layer 3 can be used as a light display area of the first display component 60, thereby realizing the display function of the first display component 60.

Since both the flexible display layer 3 and the flexible printed circuit board 1 are flexible, the first display component 60 formed by laminating the flexible display layer 3 and the flexible printed circuit board 1 is also a flexible structure, so it can be bent. In this way, based on the bendable characteristics of the first display component 60, the first display component 60 can be covered on the outer peripheral surface of the fixing tube by winding, so that the light display area of the first display component 60 can be distributed on multiple outer surfaces of the aerosol generating device, thereby increasing the display area of the aerosol generating device, so that the aerosol generating device can display more information to the user.

Figure 8:
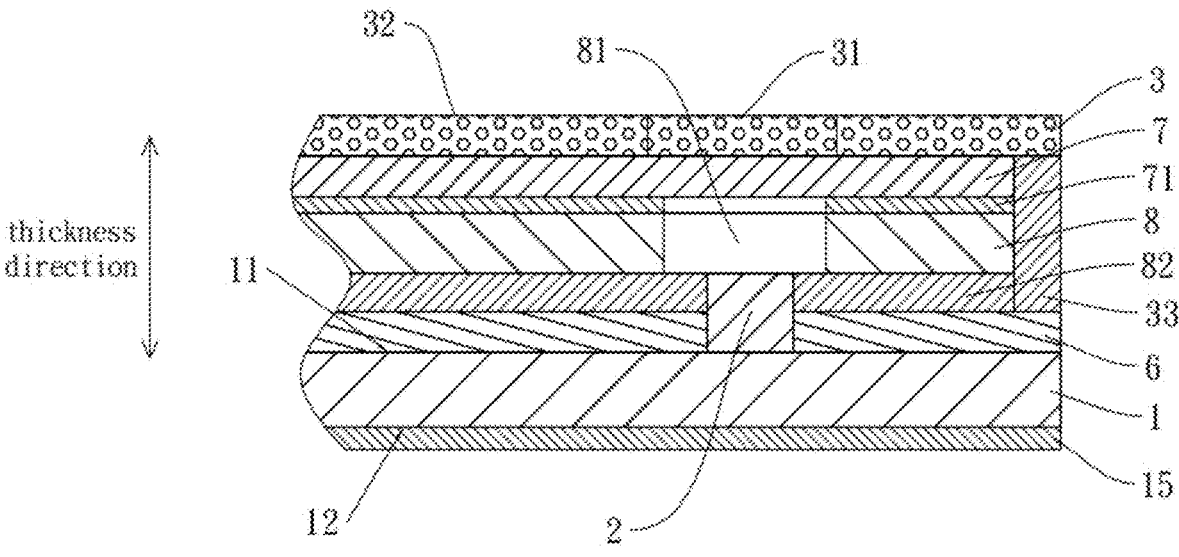
FIG. 8 is a partial sectional view of a first display component according to an embodiment of the present disclosure.

Please refer to FIG. 8, in an embodiment, the first display component 60 includes a first adhesive layer 15. The flexible printed circuit board 1 is also provided with a second surface 12 disposed opposite to the first surface 11, and the first adhesive layer 15 is disposed on the second surface 12 and bonded to the fixing tube. In this way, in some use scenarios where the first display component 60 of this embodiment is applied to an aerosol generating device, the entire first display component 60 can be quickly attached to the outer surface of the fixing tube through the first adhesive layer 15, thereby facilitating the installation convenience of the first display component 60. In a specific implementation, the first adhesive layer 15 can be a double-sided adhesive, a structural adhesive, or other types of glue, as long as it can meet the use requirements, and this embodiment does not impose specific restrictions on this.

Figure 6:
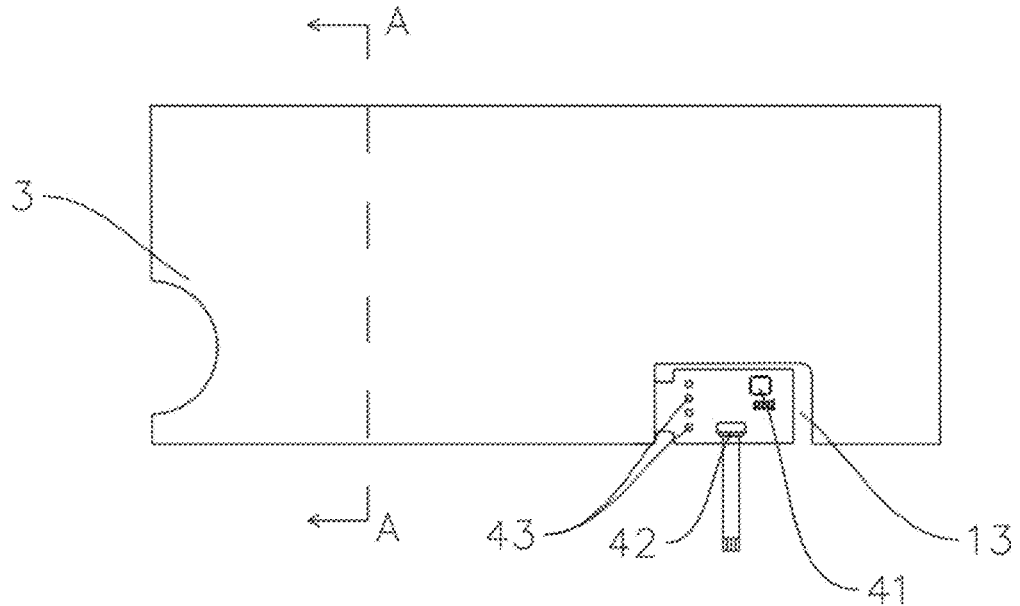
FIG. 6 is a structural schematic diagram of the first display component of the aerosol generating device shown in FIG. 1 in an unfolded state.
Figure 9:
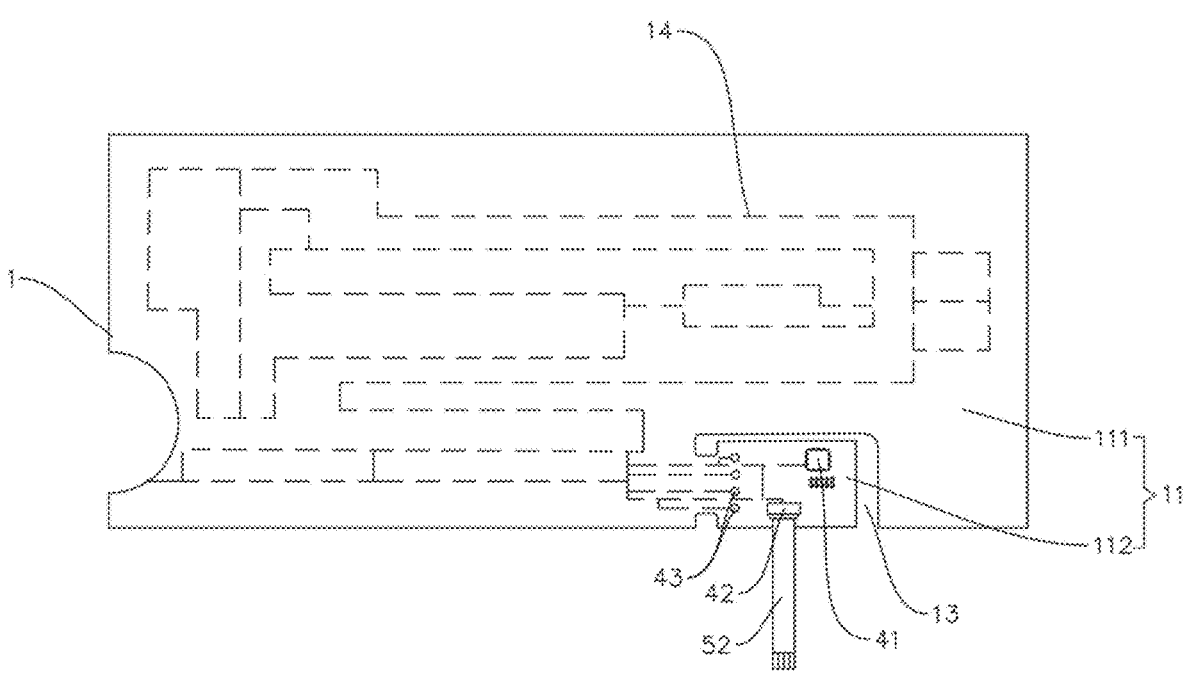
FIG. 9 is a front view of a flexible printed circuit board according to an embodiment of the present disclosure.

As shown in FIG. 6 and FIG. 9, in an embodiment of the present disclosure, the first display component 60 also includes a current driving element 41 and a current input interface 42. The first surface 11 has a first mounting area 111 and a second mounting area 112 that are connected to each other. The area of the first mounting area 111 is larger than that of the second mounting area 112. The second mounting area 112 is located at the edge of the flexible printed circuit board 1 (for example, assuming that the flexible printed circuit board 1 is a strip sheet with a certain length and width, the second mounting area 112 can be located at the length edge or the width edge of the flexible printed circuit board 1). Multiple light-emitting elements 2 are fixed on the first mounting area 111, and the current driving element 41 and the current input interface 42 are installed at intervals on the second mounting area 112 and are both electrically connected to the circuit track 14.

In this embodiment, by providing a current input interface 42 electrically connected to the circuit track 14, in some use scenarios where the first display component 60 of this embodiment is applied to an aerosol generating device, it is convenient to electrically connect each light-emitting element 2 in the first display component 60 with the controller of the aerosol generating device. For example, in a specific application, only one end of a wire needs to be connected to the current input interface 42, and the other end of the wire needs to be connected to the controller of the aerosol generating device. In this way, the electrical connection between each light-emitting element 2 and the controller of the aerosol generating device can be quickly achieved, which is very convenient to operate. The structural form of the current input interface 42 can be a universal connector or other types of communication interfaces, as long as it can meet the use requirements, and this embodiment does not impose specific restrictions on this.

In this embodiment, by providing a driving element electrically connected to the circuit track 14, in some use scenarios where the first display component 60 of this embodiment is applied to an aerosol generating device, after the power supply component of the aerosol generating device is connected through the current input interface 42, it is possible to facilitate the power supply component to drive each light-emitting element 2 to emit light in a preset manner, so as to display the required information on the flexible display layer 3. In a specific implementation, the driving element can adopt a driving chip commonly used in the art, and its specific structure and use principle are well known to those skilled in the art, and will not be described in detail here.

As shown in FIG. 6, FIG. 9, FIG. 10 and FIG. 14, in an embodiment of the present disclosure, an avoidance notch 13 is provided at the edge of the flexible printed circuit board 1, and the second mounting area 112 is located in the avoidance notch 13. The area of the first surface 11 of the flexible printed circuit board 1 other than the second mounting area 112 is the first mounting area 111. Compared with the arrangement in which the second mounting area 112 of the flexible printed circuit board 1 is convexly arranged on the edge of the flexible printed circuit board 1 (as shown in FIG. 11), in some use scenarios where the first display component 60 of this embodiment is applied to an aerosol generating device, it is beneficial to reduce the risk of interference between the first mounting area 111 and the second mounting area 112 during the process of installing the first display component 60 on the outer surface of the aerosol generating device along the circumferential direction of the aerosol generating device, thereby facilitating the increase of the display area of the first display component 60 in the circumferential direction of the aerosol generating device. For example, assuming that the first display component 60 is a flexible strip sheet with a certain length and width, if the second mounting area 112 of the flexible printed circuit board 1 is protruded on one of the width edges of the flexible printed circuit board 1 (as shown in FIG. 7). Then, in the process of mounting the strip-shaped first display component 60 on the outer surface of the aerosol generating device in a surrounding manner along the circumferential direction of the aerosol generating device, the second mounting area 112 of the flexible printed circuit board 1 is likely to overlap with the other width edge of the flexible printed circuit board 1 and interfere with the end of the first mounting area 111 away from the second mounting area 112, thereby making it difficult for the first display component 60 to enclose a complete closed-loop structure, which is not conducive to maximizing the display area of the aerosol generating device along its circumferential direction.

In the technical solution provided in this embodiment, since the second mounting area 112 of the flexible printed circuit board 1 is designed to be avoided, that is, the second mounting area 112 of the flexible printed circuit board 1 is located in the avoidance notch 13 opened at the edge of the flexible printed circuit board 1. In this way, in the process of installing the first display component 60 on the outer surface of the aerosol generating device along the circumferential direction of the aerosol generating device, it is possible to effectively avoid the end of the first mounting area 111 away from the second mounting area 112 from interfering with the second mounting area 112, so that the first display component 60 can be easily enclosed into an open ring or a complete closed-loop structure, which is beneficial to maximize the display area of the aerosol generating device along its circumferential direction.

Figure 10:
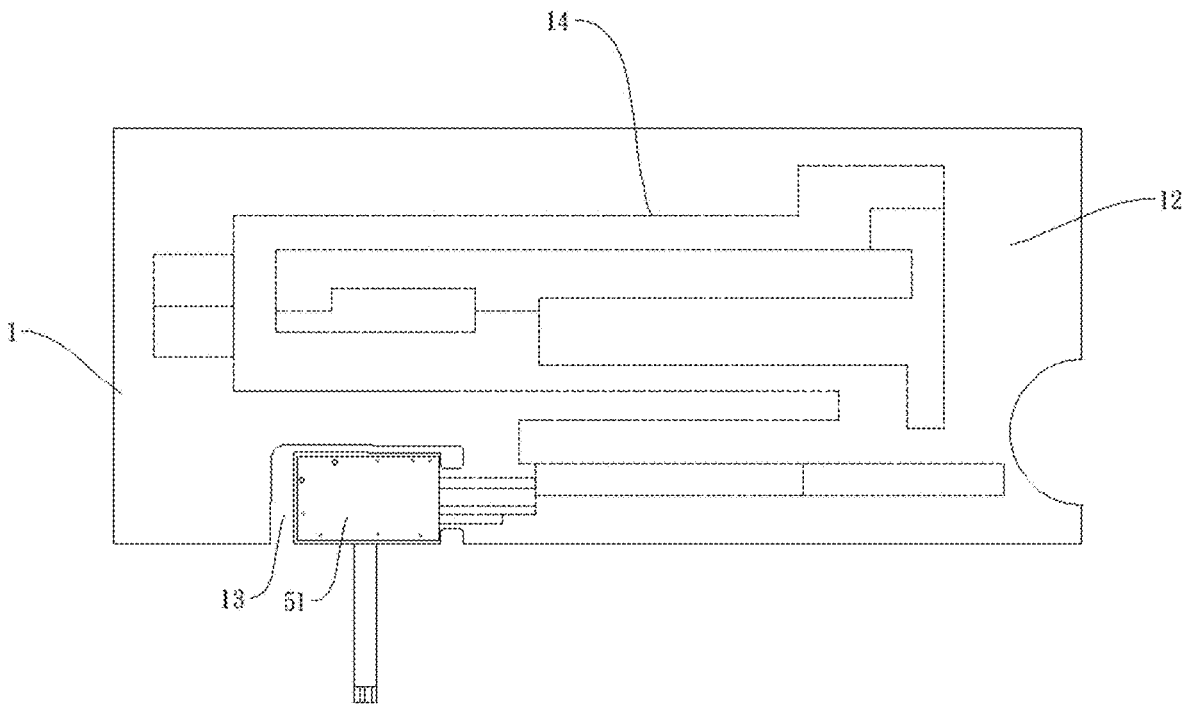
FIG. 10 is a back view of a flexible printed circuit board according to an embodiment of the present disclosure.
Figure 11:
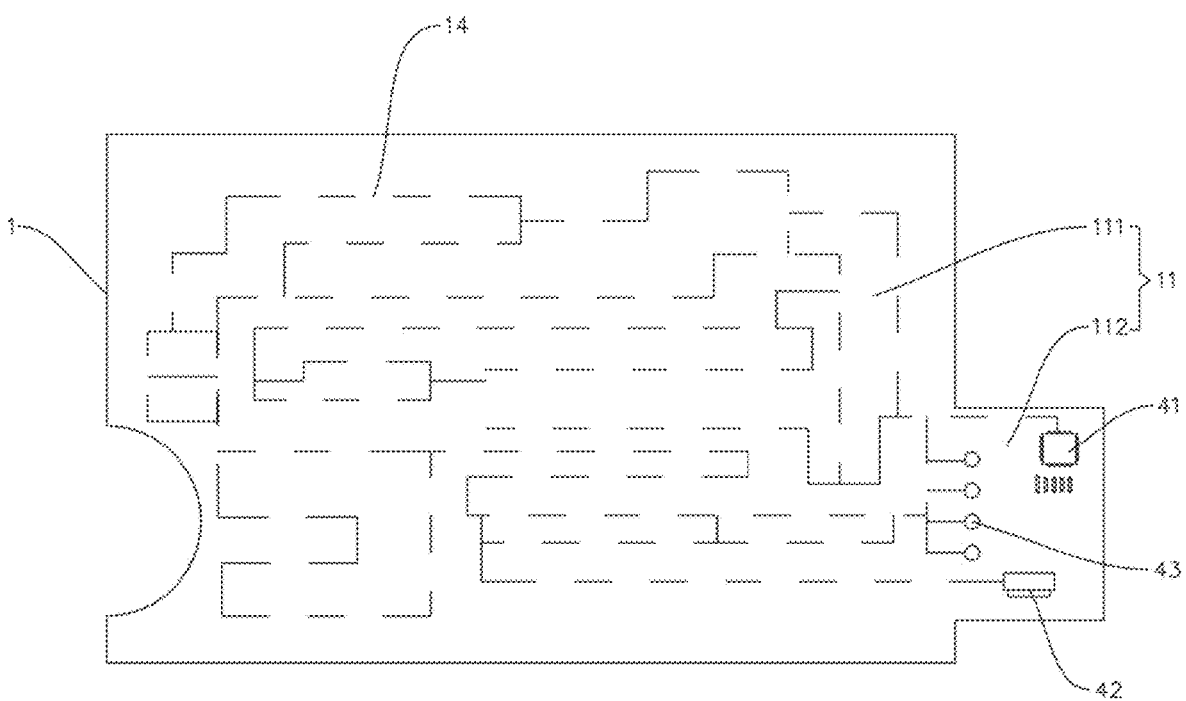
FIG. 11 is a front view of a flexible printed circuit board according to another embodiment of the present disclosure.

In this embodiment, in some specific application scenarios, when the flexible printed circuit board 1 is a strip-shaped sheet with a certain length and width, an avoidance notch 13 for accommodating the second mounting area 112 can be opened on the length edge of the flexible printed circuit board 1 (as shown in FIGS. 9-10), and can also be opened on the width edge of the flexible printed circuit board 1. This embodiment does not impose specific restrictions on this.

As shown in FIG. 9, in an embodiment of the present disclosure, a plurality of test points 43 made of metal material are also exposed and arranged on the second mounting area 112 of the flexible printed circuit board 1, and the plurality of test points 43 are electrically connected to the circuit track 14 of the flexible printed circuit board 1. In this way, by providing a plurality of test points 43 made of metal material, it is convenient for testers to perform corresponding functional tests or fault tests on the first display component 60.

As shown in FIG. 9, in an embodiment of the present disclosure, the first display component 60 further includes a flexible flat cable 52, one end of which is plugged into the current input interface 42. With such a configuration, in some use scenarios where the first display component 60 of this embodiment is applied to an aerosol generating device, it is convenient for the installer to quickly electrically connect the first display component 60 to the power supply component of the aerosol generating device. In specific operations, it is only necessary to plug the end of the flexible flat cable 52 away from the current input interface 42 into the communication interface of the power supply component, which is very convenient.

As shown in FIG. 9 and FIG. 10, in an embodiment of the present disclosure, the first display component 60 further includes a metal sheet 51, which is fixed to the side of the flexible film facing away from the second mounting area 112. In this embodiment, the metal sheet 51 can reinforce the portion of the flexible printed circuit board 1 that includes the second mounting area 112 (i.e., enhance its strength), making this portion resistant to bending. This prevents repeated bending of this portion from affecting the stability of the electrical connections between the components in the second mounting area 112 and the circuit track 14.

As shown in FIG. 8, in an embodiment of the present disclosure, the first display component 60 further includes a flexible reflective layer 6, which covers the first surface 11 of the flexible printed circuit board 1, and each light-emitting element 2 is exposed from the flexible reflective layer 6. In this embodiment, the flexible reflective layer 6 can improve the light display effect of the first display component 60 while ensuring that the first display component 60 can be bent. Specifically, after the light emitted by the light-emitting elements 2 is irradiated to the second light-transmitting areas 31 of the flexible display layer 3, a part of the light will be reflected. The presence of the flexible reflective layer 6 can, to a certain extent, reflect the part of the reflected light back to the second light-transmitting areas 31 of the flexible display layer 3, thereby improving the utilization rate of the light, so that the first display component 60 can obtain a better light display effect. In a specific implementation, the flexible reflective layer 6 can be a flexible reflective film (such as a transparent polyimide film), or a paint layer (to achieve a better reflective effect, a white paint layer can be used as the flexible reflective layer 6), or a reflective ink layer, as long as it can meet the use requirements, and this embodiment does not impose any specific restrictions on this.

Figure 12:
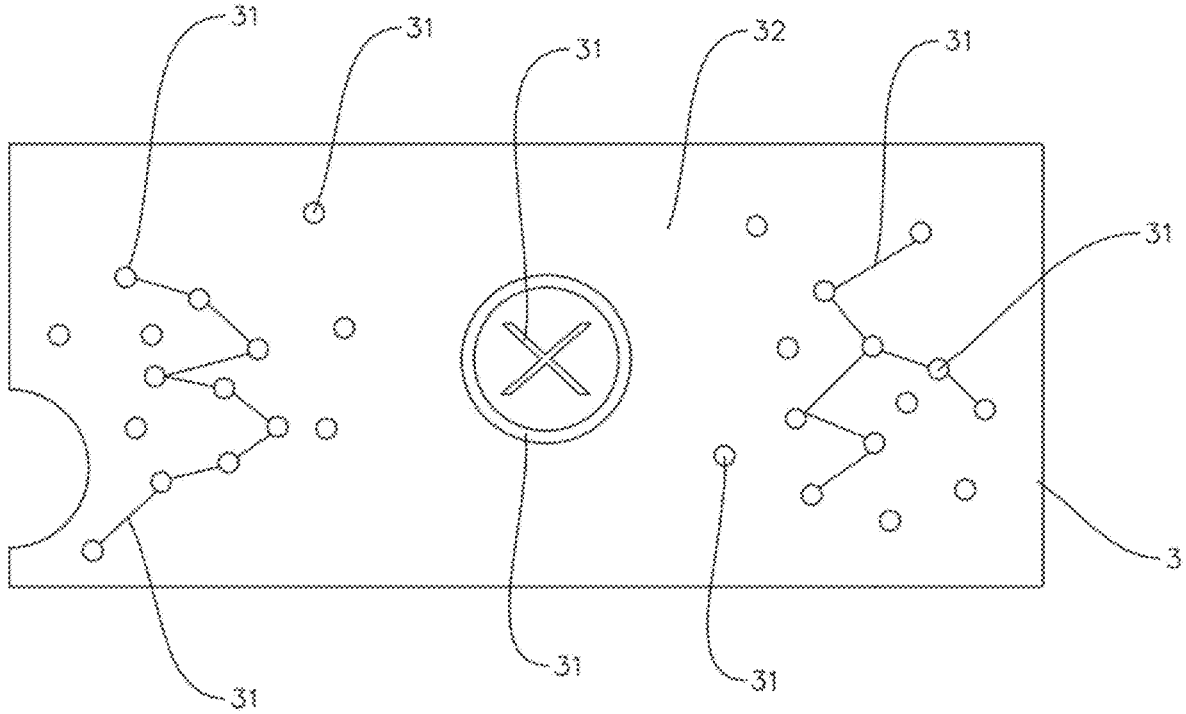
FIG. 12 is a plan view of a flexible display layer according to an embodiment of the present disclosure.
Figure 13:
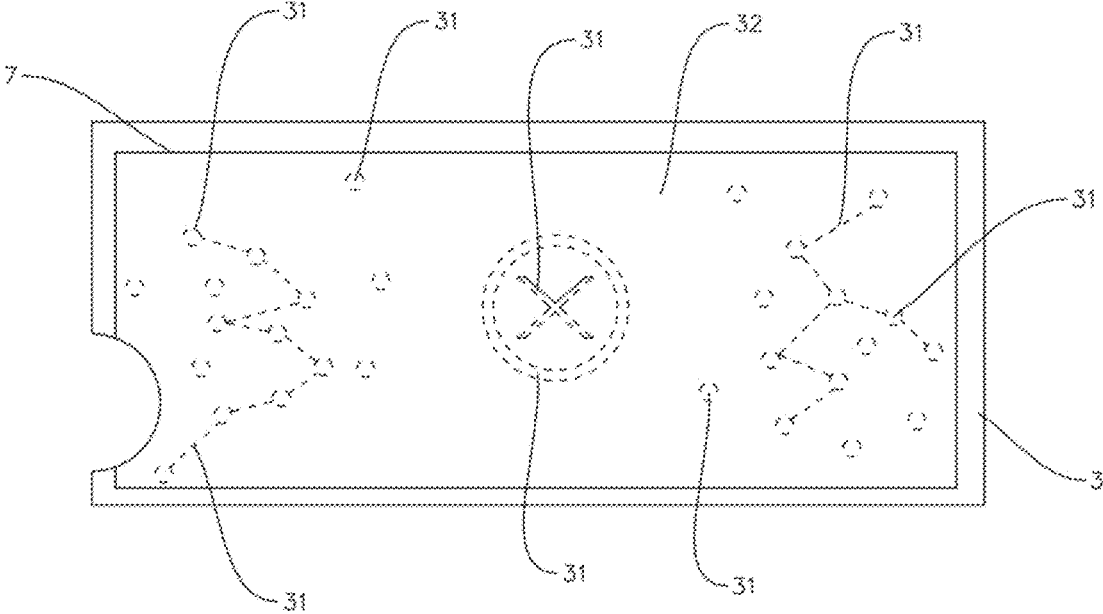
FIG. 13 is a plan view of the combination of a flexible display layer and a flexible diffusion layer according to an embodiment of the present disclosure.

As shown in FIG. 8, FIG. 12 and FIG. 13, in an embodiment of the present disclosure, the first display component 60 also includes a flexible diffusion layer 7. The flexible diffusion layer 7 can be attached to the surface of the flexible display layer 3 facing the flexible printed circuit board 1 by glue or the like, and the flexible diffusion layer 7 covers each second light-transmitting area 31. In this embodiment, by arranging the flexible diffusion layer 7 between the plurality of light-emitting elements 2 and the plurality of second light-transmitting areas 31, the flexible diffusion layer 7 can evenly diffuse the light emitted by the light-emitting elements 2, so that the light emitted by the light-emitting element 2 can be more evenly diffused to the second light-transmitting areas 31 of the flexible display layer 3, thereby improving the uniformity of the light display of the first display component 60. In particular, the flexible diffusion layer 7 can be a transparent flexible film coated with fluorescent ink, or other types of flexible diffusion films, as long as it can meet the use requirements, and this embodiment does not impose specific restrictions on this. In an embodiment, the flexible diffusion layer 7 is a yellow fluorescent ink film sheet, and the light emitted by the light-emitting element 2 is blue light. In an embodiment, a fourth adhesive layer 71 is provided on the surface of the flexible diffusion layer 7 facing away from the flexible display layer 3, so that the flexible diffusion layer 7 is adhered to the flexible printed circuit board 1 (or the flexible reflective layer 6, or the flexible light-shielding layer 8 described later). The fourth adhesive layer 71 can be a glue layer of the type of double-sided tape, structural adhesive, etc.

Figure 14:
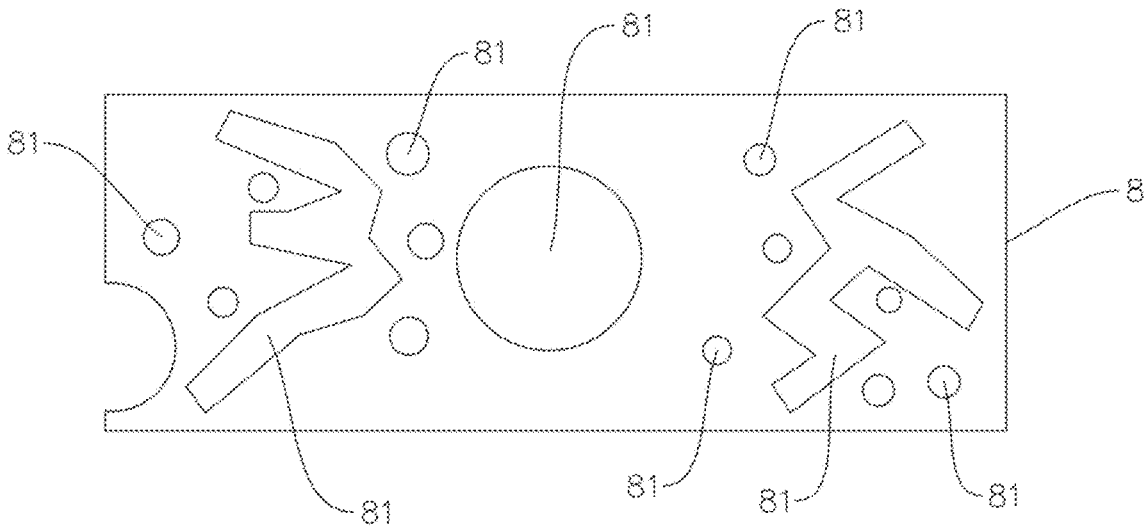
FIG. 14 is a plan view of a flexible light-shielding layer according to an embodiment of the present disclosure.
Figure 15:
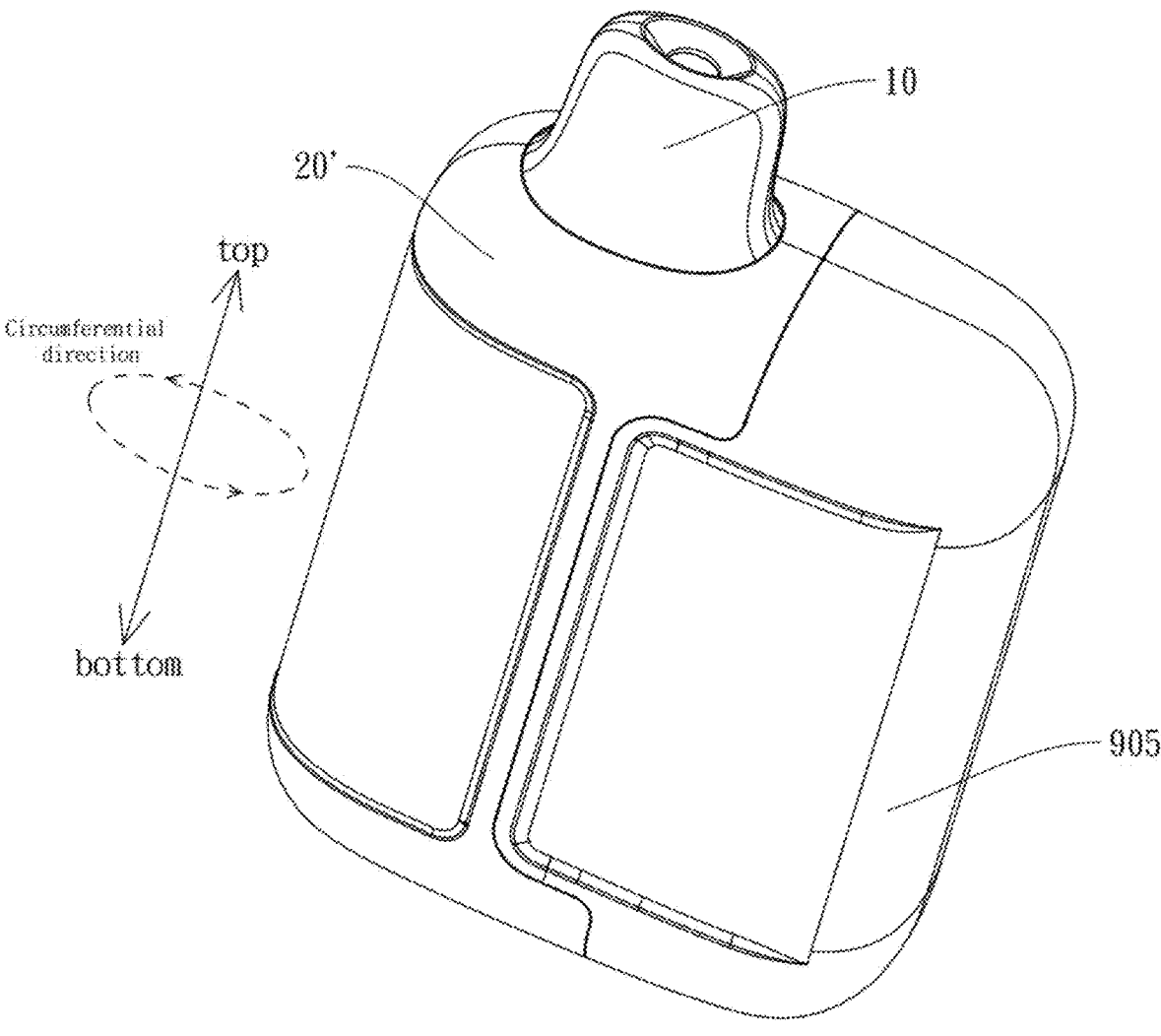
FIG. 15 is a perspective view of an aerosol generating device according to another embodiment of the present disclosure.
Figure 16:
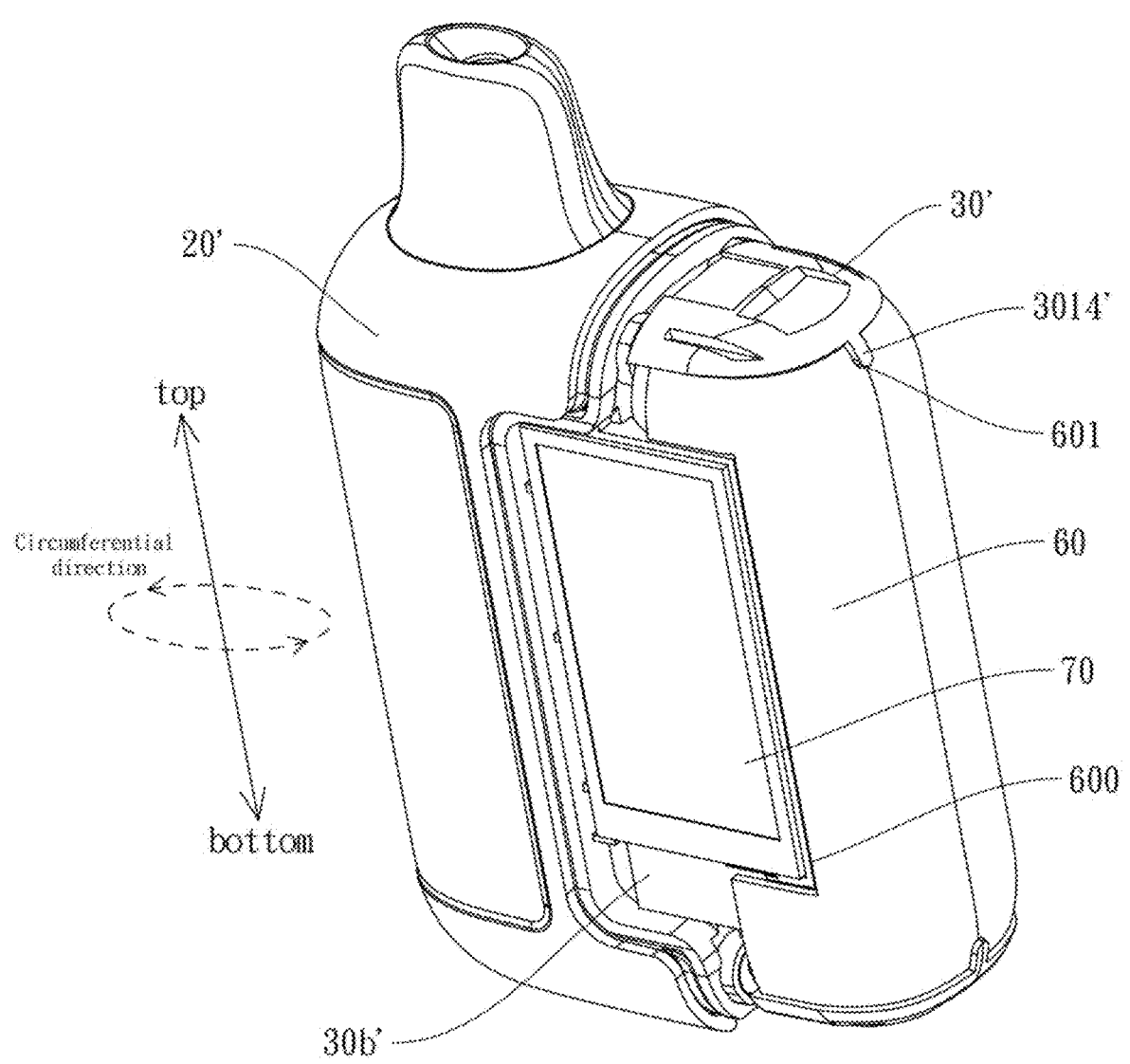
FIG. 16 is a perspective view of the aerosol generating device of FIG. 15 with the light-transmitting protective cover removed.
Figure 17:
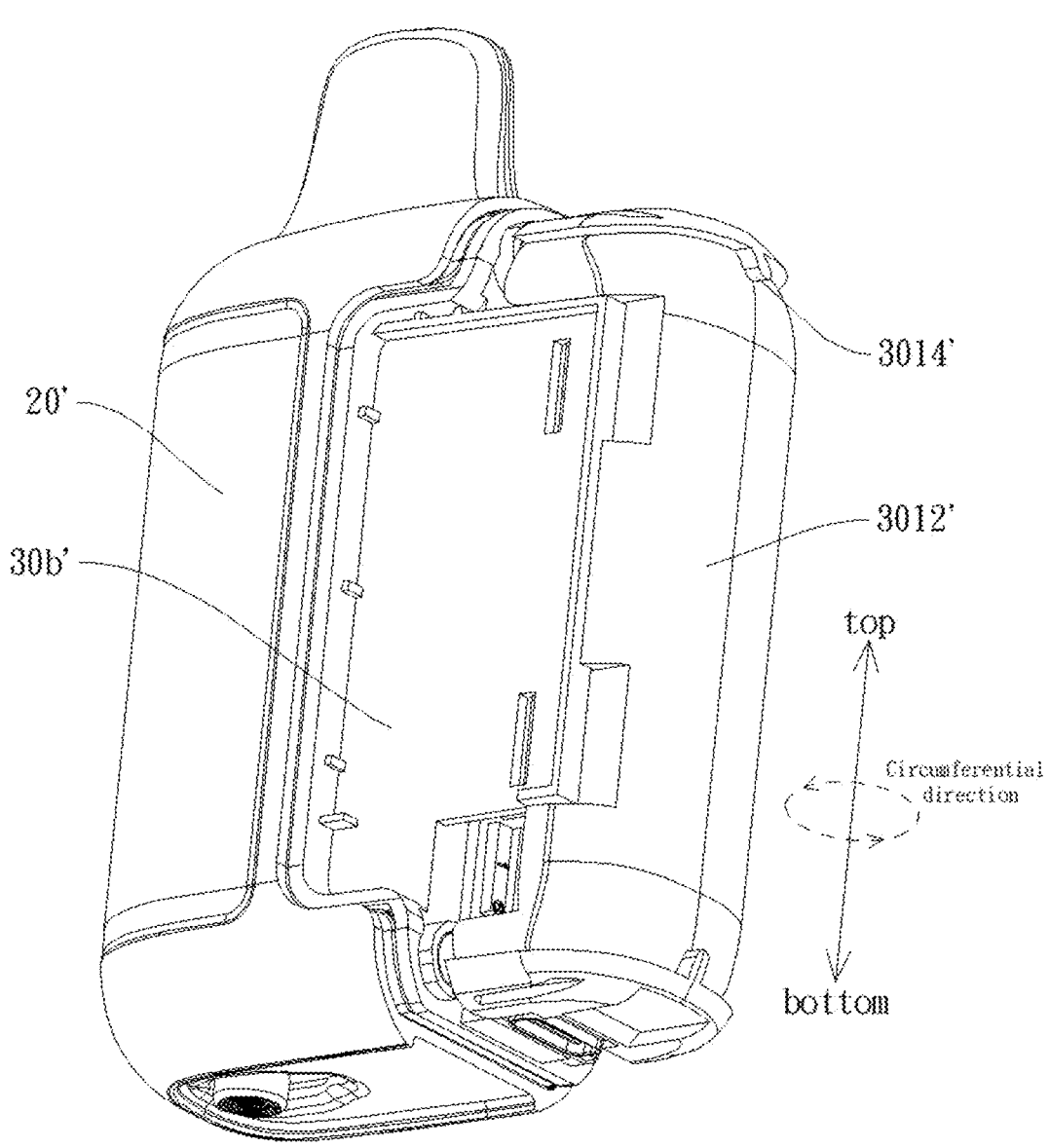
FIG. 17 is a perspective view of the aerosol generating device of FIG. 16 with the first display component and the second display component removed.
Figure 18:
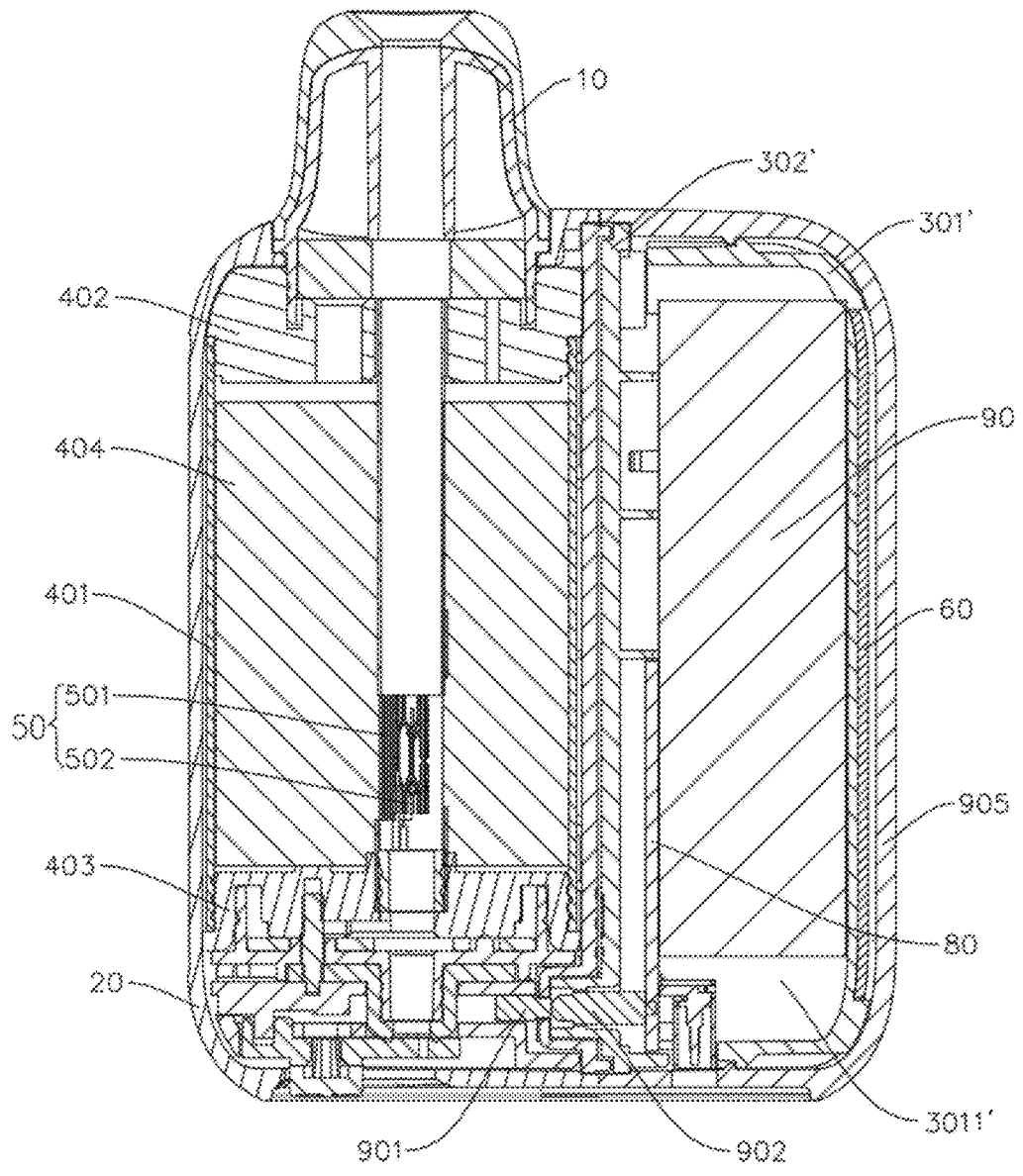
FIG. 18 is a sectional view of the aerosol generating device shown in FIG. 15.
Figure 19:
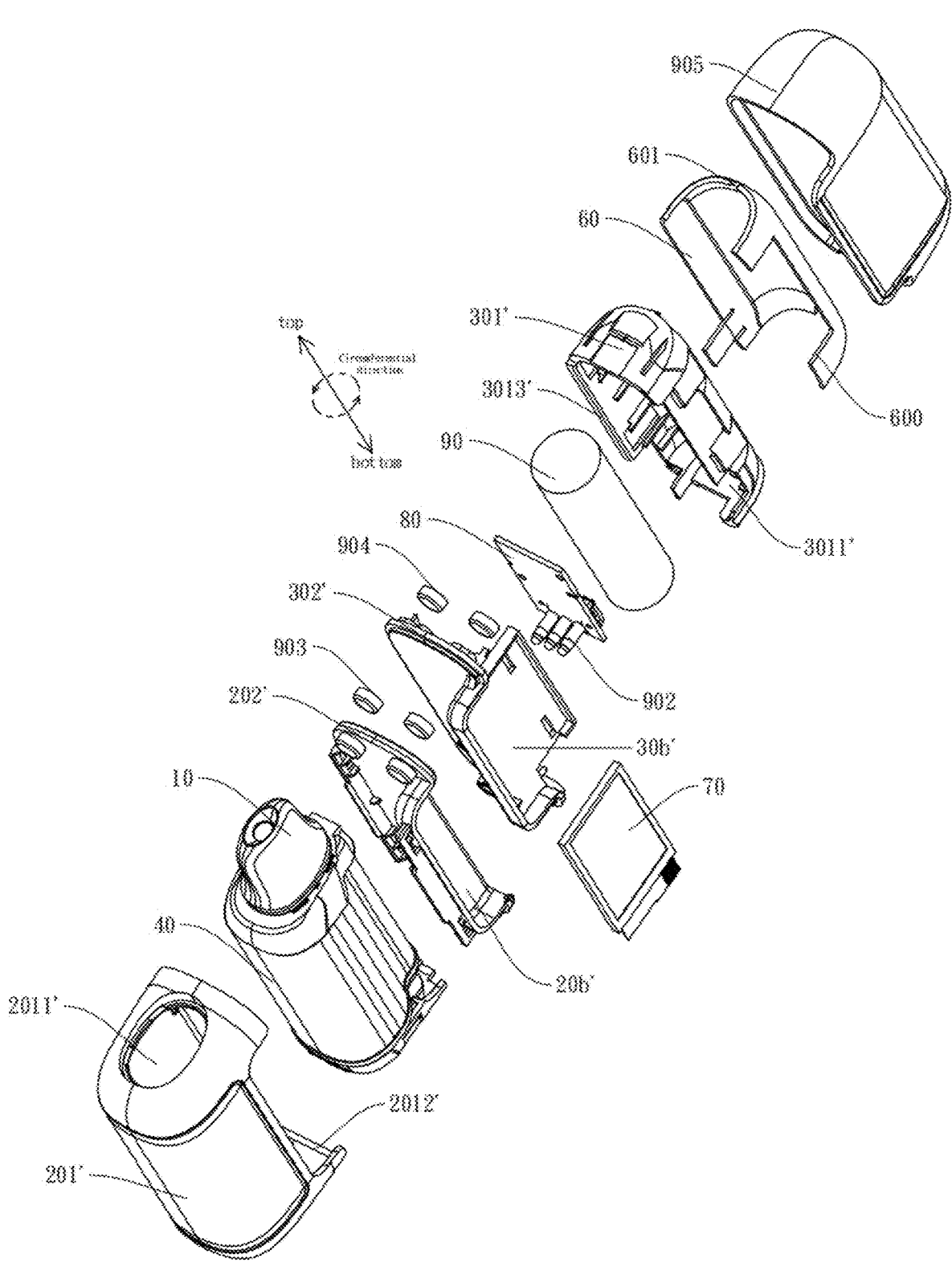
FIG. 19 is an exploded view of the aerosol generating device shown in FIG. 15.
Figure 20:
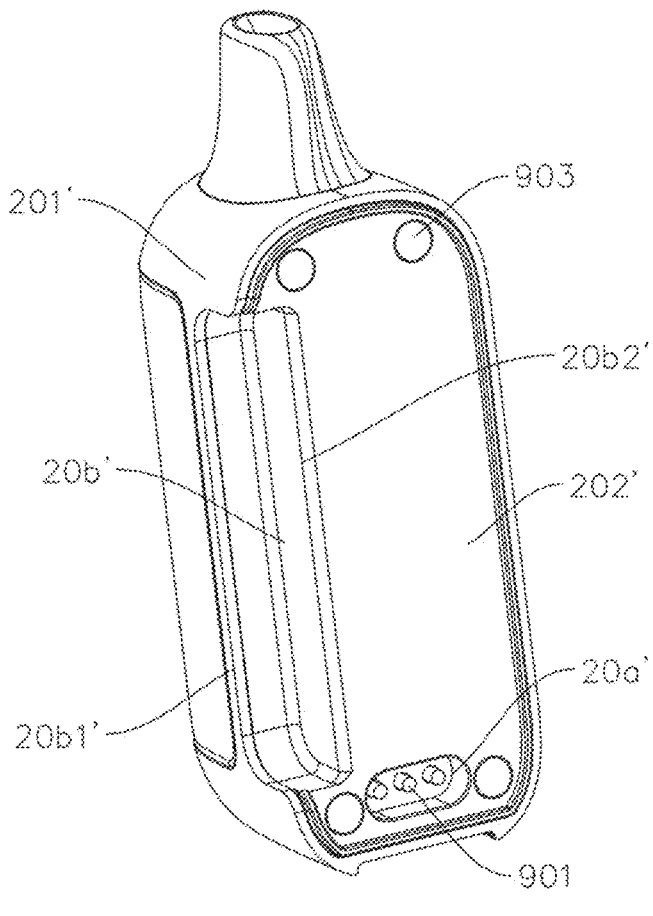
FIG. 20 is a perspective view of a partial structure of the aerosol generating device shown in FIG. 15.
Figure 21:
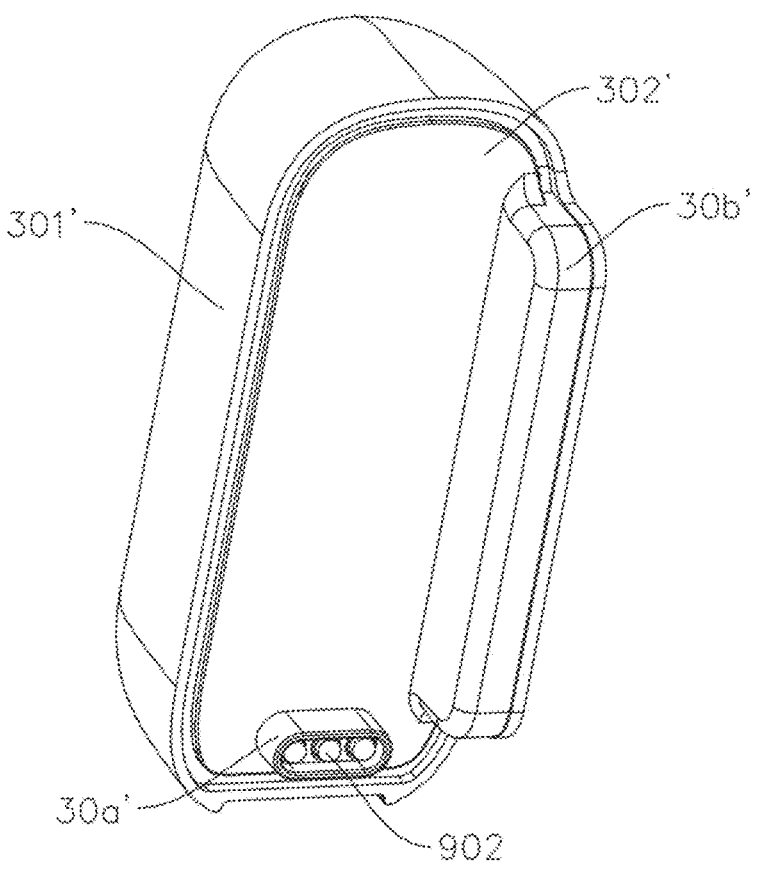
FIG. 21 is a perspective view of a partial structure of the aerosol generating device shown in FIG. 15.

As shown in FIG. 8 and FIG. 14, in an embodiment of the present disclosure, the first display component 60 also includes a flexible light-shielding layer 8, and a plurality of light-transmitting holes 81 are opened on the flexible light-shielding layer 8. The flexible light-shielding layer 8 is sandwiched between the flexible printed circuit board 1 and the flexible display layer 3, and each light-transmitting hole 81 is arranged opposite to at least one second light-transmitting area 31. In this embodiment, the setting of the flexible light-shielding layer 8 can reduce the loss of light emitted by the light-emitting elements 2, so that the light emitted by the light-emitting elements 2 can be more fully and concentratedly transmitted to the second light-transmitting areas 31 of the flexible display layer 3, thereby facilitating the improvement of the light display effect of the first display component 60. In the specific implementation, the flexible light-shielding layer 8 can be made of non-transparent flexible materials such as silicone, rubber, silicone rubber, etc., as long as it can meet the use requirements, and this embodiment does not impose specific restrictions on this.

As shown in FIG. 8, in an embodiment of the present disclosure, a second adhesive layer 82 is provided on the surface of the flexible light-shielding layer 8 facing the flexible printed circuit board 1. Thus, by providing the second adhesive layer 82, the flexible light-shielding layer 8 can be quickly laminated on the first surface 11 of the flexible printed circuit board 1 or the flexible light-shielding layer 8 can be quickly laminated on the flexible reflective layer 6. In the specific implementation, the second adhesive layer 82 can be a double-sided adhesive, a structural adhesive or other types of glue, as long as it can meet the use requirements, and this embodiment does not impose specific restrictions on this.

Based on the bendable property of the first display component 60, the first display component 60 can simultaneously cover multiple outer surfaces of the fixing member 30 in a winding manner, so that the light display area of the first display component 60 can be distributed on multiple outer surfaces of the aerosol generating device, thereby increasing the display area of the aerosol generating device and enabling the aerosol generating device to display more information to the user.

The aerosol generating device of the present invention further includes a light-transmitting protective cover 92, which covers the display window 205 and is connected to the housing 20. The light-transmitting protective cover 92 can protect the portion of the first display component 60 located in the display window 205 area to prevent the user from touching the first display component 60. In an embodiment, the light-transmitting protective cover 92 is detachably connected to the housing 20. In an embodiment, the light-transmitting protective cover 92 is detachably connected to the housing 20 by buckling.

In this embodiment, thanks to the above improvements, the aerosol generating device of this embodiment has the advantage of a large display area and can display more visual information to the user. In specific implementation, the first display component 60 can be arranged around the outer housing 209 in a semi-enclosed manner (in this case, the first display component 60 can be enclosed in an open loop such as a "U" shape) or a fully enclosed manner (in this case, the first display component 60 can be enclosed in a closed loop such as an "O" shape) along the circumferential direction of the outer housing 209. The specific encircling manner of the first display component 60 can be determined according to actual use requirements, and this embodiment does not impose specific restrictions on this.

As shown in FIG. 15 to FIG. 21, the present disclosure provides another aerosol generating device. The structure of the aerosol generating device is similar to that of the above embodiment, and both include a mouthpiece 10, a housing, a vaporizer core 50, a first display component 60, a second display component 70, a controller 80, a battery 90, and a light-transmitting protective cover 905. The main difference between this embodiment and the above embodiment is that the aerosol generating device of this embodiment further includes a first accommodating shell 20', a second accommodating shell 30', a first electrode 901, and a second electrode 902. The first accommodating shell 20' and the second accommodating shell 30' constitute the housing of the aerosol generating device, that is, the housing includes the first accommodating shell 20' and the second accommodating shell 30', the liquid storage component 40 and the vaporizer core 50 are both located in the first accommodating shell 20', and the battery 90 is located in the second accommodating shell 30'. In an embodiment, the battery 90 is a rechargeable battery. It can be understood that as long as it can accommodate and install at least part of the components of the aerosol generating device, the shape and structure of the housing are not specifically limited here.

The first accommodating shell 20' and the second accommodating shell 30' are detachably connected, and the side wall of the first accommodating shell 20' is provided with a first docking portion 20a' and an avoidance groove 20b', and the avoidance groove 20b' is located at the outer wall surface of the side wall of the first accommodating shell 20'. The first accommodating shell 20' and the second accommodating shell 30' are arranged in parallel, that is, the first accommodating shell 20' and the second accommodating shell 30' are arranged in the transverse direction of the aerosol generating device, so that even if the liquid storage component 40 leaks the aerosol generating substrate, it is not easy to affect the battery 90, thereby improving the service life.

The first accommodating shell 20' includes a first accommodating portion 201' and a first covering portion 202'. The first accommodating portion 201' is connected to the mouthpiece 10. The first accommodating portion 201' is provided with a first accommodating cavity 2011'. The side wall of the first accommodating cavity 2011' is provided with a first cavity opening 2012'. The first covering portion 202' is covered at the first cavity opening 2012', and is connected to the first magnetic attraction member 903. The first docking portion 20a' is located on the side of the first covering portion 202' facing the second accommodating shell 30'. Specifically, the first docking portion 20a' is a docking groove, and the notch of the docking groove is arranged facing the second accommodating shell 30'. The first electrode 901 is fixed at the first covering portion 202' and is electrically connected to the vaporizer core 50, and the first electrode 901 extends into the docking groove.

The avoidance groove 20b' is located at the cavity wall of the first accommodating cavity 2011', and includes a first notch 20b1' and a second notch 20b2'. The orientation of the first notch 20b1' is different from that of the second notch 20b2', and the orientation of the second notch 20b2' is the same as that of the notch of the docking groove, that is, the second notch 20b2' of the avoidance groove 20b' is arranged facing the second accommodating shell 30'. Specifically, the orientation of the first notch 20b1' is perpendicular to that of the second notch 20b2', and the orientation of the display surface of the second display component 70 is the same as that of the first notch 20b1'. It can be understood that the display surface of the second display component 70 refers to the portion of the screen of the second display component 70 used to display images and texts.

The side wall of the second accommodating shell 30' is provided with a second docking portion 30a' and a mounting protrusion 30b'. The second docking portion 30a' is a docking protrusion. The second docking portion 30a' is plugged and connected with the first docking portion 20a', that is, the docking protrusion is inserted into the docking groove, so that the second accommodating shell 30' and the first accommodating shell 20' are reliably connected together. The mounting protrusion 30b' extends into the avoidance groove 20b' through the second notch 20b2', and because the direction of the second notch 20b2' is the same as the direction of the notch of the docking groove, it is not only convenient for the second docking portion 30a' to dock with the first docking portion 20a', but also improves the reliability of the connection between the second accommodating shell 30' and the first accommodating shell 20'.

Specifically, the second accommodating shell 30' includes a second accommodating portion 301' and a second covering portion 302', and the second accommodating portion 301' is provided with a second accommodating cavity 3011' and a fixing groove 3012'. The battery 90 is located in the second accommodating cavity 3011', the side wall of the second accommodating cavity 3011' is provided with a second cavity opening 3013', and the second cavity opening 3013' is arranged facing the first cavity opening 2012'. The mounting protrusion 30b' is located at the side of the second covering portion 302'. The fixing groove 3012' is located at the outer peripheral surface of the second accommodating portion 301', and the groove wall of the fixing groove 3012' is provided with a positioning protrusion 3014'. It can be understood that in another embodiment, the mounting protrusion 30b' can be arranged at the second accommodating portion 301'.

The second covering portion 302' is covered at the second cavity opening 3013' and is detachably connected to the first covering portion 202', and the docking protrusion is located on the side of the second covering portion 302' facing the first covering portion 202'. The second electrode 902 is fixed at the second covering portion 302', and extends into the docking protrusion and is electrically connected to the battery 90. The second electrode 902 is in contact with the first electrode 901, so that the battery 90 can supply power to the vaporizer core 50 through the second electrode 902 and the first electrode 901. This arrangement of the first electrode 901 and the second electrode 902 is not easily deformed by external force, so the service life can be increased. The second covering portion 302' is connected to the second magnetic attraction member 904, and the second magnetic attraction member 904 is magnetically attracted to the first magnetic attraction member 903, so the reliability of the connection between the first accommodating shell 20' and the second accommodating shell 30' can be increased. It can be understood that the first magnetic attraction member 903 and the second magnetic attraction member 904 can be made of magnets or other ferromagnetic materials, as long as the two can be adsorbed to each other. The structures of the liquid storage component 40 and the vaporizer core 50 are the same as those of the above-mentioned embodiment, and their structures are not described again.

The first display component 60 and the second display component 70 are both installed at the second accommodating shell 30', that is, the first display component 60 and the second display component 70 can be installed at the outer surface of the second accommodating shell 30' or inside the second accommodating shell 30', and the space formed inside the second accommodating shell 30' also belongs to the category of the second accommodating shell 30'. In this embodiment, the first display component 60 is arranged around the outer peripheral surface of the second accommodating shell 30' along the circumferential direction of the second accommodating shell 30', and the second display component 70 is located at the mounting protrusion 30b', so it is not only reliably fixed and not easily damaged by external forces, but also easy to assemble and easy for users to watch.

One end of the first display component 60 and the second display component 70 are located on the same side of the second accommodating shell 30', and are located on the same side of the aerosol generating device, and the display displayed by the second display component 70 and at least part of the display of the first display component 60 are located on the same side of the aerosol generating device, so the display displayed by the first display component 60 and the display displayed by the second display component 70 can be combined to form an overall display, and the resolution of the first display component 60 is different from that of the second display component 70. Therefore, through the cooperation of the second display component 70 and the first display component 60, it is possible to realize the display of certain images at a low cost.

The first display component 60 is provided with a display matching notch 600 and a positioning notch 601, and the second display component 70 extends into the display matching notch 600, so that the first display component 60 and the second display component 70 match more closely, and the display displayed by the first display component 60 and the display displayed by the second display component 70 can be better integrated together, thereby improving the display effect. It can be understood that as long as the second display component 70 at least partially corresponds to the position of the display matching notch 600, its structure is not specifically limited here. In this embodiment, the second display component 70 at least partially corresponds to the position of the display matching notch 600 means that the orthographic projection of the display matching notch 600 on the plane where the display surface of the second display component 70 is located at least partially overlaps with the second display component 70.

The structures of the first display component 60 and the second display component 70 of this embodiment are substantially the same as those of the first display component 60 and the second display component 70 of the above-mentioned embodiment, and the difference mainly lies in the difference in shape and size. Therefore, the structures of the first display component 60 and the second display component 70 of this embodiment are not described in detail here.

Since the first accommodating shell 20' and the second accommodating shell 30' are detachably connected, the liquid storage component 40 and the vaporizer core 50 are both located in the first accommodating shell 20', and the battery 90 is located in the second accommodating shell 30'. When the aerosol generating material in the liquid storage component 40 is exhausted, the first accommodating shell 20' together with the liquid storage component 40 and the vaporizer core 50 can be disassembled and replaced as a whole, and the second accommodating shell 30' and the battery 90 therein can still be used. Therefore, it is not only convenient for users to use, but also more environmentally friendly.

In summary, since at least part of the first display component 60 and at least part of the second display component 70 are located on the same side of the housing, the display displayed by the first display component 60 and the display displayed by the second display component 70 can be combined to form an overall display. Since the resolution of the first display component 60 is different from that of the second display component 70, the clever combination of the two can display a specific image with rich displays, thereby reducing costs and facilitating promotion and application.

It should be noted herein that other contents of the the aerosol generating device disclosed in various embodiments of the present disclosure that are not described in detail can be found in the prior art and will not be repeated herein.

The above are only example embodiments of the present disclosure, and is not intended to limit the patent scope of the present disclosure. Any equivalent structural transformations made under the technical concept of the present disclosure utilizing the contents of the specification of the present disclosure and the accompanying drawings, or directly/indirectly utilized in other related fields of technology, are all included in the scope of protection of the present disclosure.

What is claimed is:

1. An aerosol generating device, comprising:
a housing;
a first display component; and
a second display component,
wherein at least part of the first display component and at least part of the second display component are provided at the same side of the housing, a resolution of the first display component is different from a resolution of the second display component, the first display component is provided with a display matching notch, and the second display component is configured to extend into the display matching notch.

2. The aerosol generating device according to claim 1, wherein:
the housing comprises an outer casing and a fixing member;
the outer casing is provided with a first light-transmitting area and a display window;

the fixing member is provided inside the outer casing;
the first display component is installed at an outer surface of the fixing member, and at least part of the first display component corresponds to a position of the display window; and
the second display component is provided inside the outer casing, and at least part of the second display component corresponds to a position of the first light-transmitting area.

3. The aerosol generating device according to claim 2, wherein a position of the display matching notch corresponds to the position of the first light-transmitting area.

4. The aerosol generating device according to claim 2, wherein the first display component is a bendable flexible display component, and the flexible display component is wrapped around a side of the fixing member.

5. The aerosol generating device according to claim 4, wherein:
the first display component comprises a flexible printed circuit board with circuit track, a plurality of light-emitting elements, a flexible reflective layer, and a flexible display layer;
the flexible printed circuit board is provided with a first surface and a second surface disposed opposite to the first surface along a thickness direction of the flexible printed circuit board;
the second surface of the flexible printed circuit board is wrapped around the side of the fixing member;
the light-emitting elements are provided at intervals on the first surface and electrically connected to the circuit track;
the flexible display layer is fixedly laminated on the first surface and covers each light-emitting element;
the flexible display layer is provided with a plurality of second light-transmitting areas, each of the second light-transmitting areas is opposite to at least one light-emitting element, and areas of the flexible display layer other than the second light-transmitting areas are light-shielding areas;
the flexible reflective layer covers the first surface of the flexible printed circuit board, and the light-emitting elements are exposed from the flexible reflective layer; and
a position of the flexible display layer corresponds to the position of the display window.

6. The aerosol generating device according to claim 2, wherein:
the outer casing comprises a top cover, a bottom cover, and a side cover, and the fixing member is provided between the top cover and the bottom cover;
a first end of the fixing member is connected to the top cover;
a first end of the side cover is connected to the top cover, and a second end of the side cover is connected to the bottom cover, and
the first light-transmitting area is located on the side cover.

7. The aerosol generating device according to claim 6, further comprising:
a supporting seat provided between the fixing member and the bottom cover,
wherein the supporting seat is connected to the second end of the fixing member, and the top cover, bottom cover, and side cover are integrally formed.

8. The aerosol generating device according to claim 7, further comprising:
a liquid storage component;

wherein the liquid storage component comprises a liquid storage tube, a first elastic sealing seat, and a second elastic sealing seat;

the fixing member is a fixing tube provided with a tube body portion, one end of the tube body portion facing the top cover is configured to extend in a direction of a central axis of the tube body to form an end wall portion, and the end wall portion abuts against the top cover; and the liquid storage tube is provided inside the tube body portion, the first elastic sealing seat is provided at a first end of the tube body portion and elastically abuts against the end wall portion, and the second elastic sealing seat is provided at a second end of the tube body portion and connected to the supporting seat.

9. The aerosol generating device according to claim 2, wherein the fixing member is a fixing tube, and the first display component is installed at a side of the fixing tube.

10. The aerosol generating device according to claim 9, wherein the side of the fixing tube is provided with a fixing groove, and at least part of the first display component is inserted into the fixing groove.

11. The aerosol generating device according to claim 9, wherein a side wall of the fixing tube is provided with an accommodating hole, the accommodating hole corresponds to the position of the first light-transmitting area, and the second display component is at least partially provided in the accommodating hole.

12. The aerosol generating device according to claim 2, further comprising a light-transmitting protective cover provided at the display window and connected to the outer casing.

13. The aerosol generating device according to claim 2, wherein the display window is configured to pass through a first side, a second side, and a third side of the outer casing, the first side of the outer casing is opposite to the third side of the outer casing, and the second side of the outer casing is connected to the first side and the third side.

14. The aerosol generating device according to claim 1, wherein the first display component is wrapped around an outer surface of the housing, and one end of the first display component is provided at the same side of the housing as the second display component.

15. The aerosol generating device according to claim 1, wherein one end of the first display component and the second display component are provided at the same side of the aerosol generating device.

16. The aerosol generating device according to claim 1, wherein the resolution of the second display component is higher than the resolution of the first display component.

17. The aerosol generating device according to claim 1, wherein a first display displayed by the first display component and a second display displayed by the second display component are combined to form an overall display.

18. The aerosol generating device according to claim 1, wherein the first display component is a bendable flexible display component and is wrapped around the housing along a circumferential direction of the housing, and the second display component is a liquid crystal display screen or an organic light emitting diode display screen.

19. The aerosol generating device according to claim 1, further comprising:

a liquid storage component;

a vaporizer core; and a battery, wherein the housing comprises a first accommodating shell and a second accommodating shell detachably connected to the first accommodating shell; the liquid storage component and the vaporizer core are both provided inside the first accommodating shell; the battery is provided inside the second accommodating shell and is configured to supply power to the vaporizer core; the first display component and the second display component are both installed at the second accommodating shell, and at least part of the first display component and at least part of the second display component are provided at the same side of the second accommodating shell.

20. An aerosol generating device, comprising:

a housing;

a first display component;

a second display component;

a liquid storage component;

a vaporizer core; and a battery, wherein:

at least part of the first display component and at least part of the second display component are provided at the same side of the housing, and a resolution of the first display component is different from a resolution of the second display component;

the housing comprises a first accommodating shell and a second accommodating shell detachably connected to the first accommodating shell; the liquid storage component and the vaporizer core are both provided inside the first accommodating shell; the battery is provided inside the second accommodating shell and is configured to supply power to the vaporizer core; the first display component and the second display component are both installed at the second accommodating shell, and at least part of the first display component and at least part of the second display component are provided at the same side of the second accommodating shell;

a side wall of the first accommodating shell is provided with an avoidance groove, the avoidance groove comprises a first notch and a second notch, and an orientation of the first notch is different from an orientation of the second notch;

a side wall of the second accommodating shell is provided with a mounting protrusion, and the mounting protrusion is configured to extend into the avoidance groove through the second notch; and at least part of the second display component is provided at the mounting protrusion, and an orientation of a display surface of the second display component is the same as the orientation of the first notch.

21. The aerosol generating device according to claim 20, wherein the side wall of the first accommodating shell is further provided with a first docking portion, the side wall of the second accommodating shell is further provided with a second docking portion, and the first docking portion is plug-connected with the second docking portion.

22. The aerosol generating device according to claim 21, further comprising:

a first electrode; and a second electrode, wherein the first docking portion comprises a docking groove, the first electrode is at least partially provided in the docking groove and electrically connected to the vaporizer core;

the second docking portion comprises a docking protrusion, the docking protrusion is inserted in the docking groove, and the second electrode is at least partially provided in the docking protrusion and electrically connected to the battery; and the second electrode is configured to abut against the first electrode, and the orientation of the second notch is the same as an orientation of a notch of the docking groove.

23. The aerosol generating device according to claim 19, wherein the first accommodating shell and the second accommodating shell are provided in parallel.

24. The aerosol generating device according to claim 19, wherein:

the first accommodating shell comprises a first accommodating portion and a first covering portion, and the first accommodating portion is provided with a first accommodating cavity;

a first cavity opening is provided at a side wall of the first accommodating cavity, and the first covering portion is covered at the first cavity opening;

the liquid storage component is provided in the first accommodating cavity, and the vaporizer core is provided in the liquid storage component;

the second accommodating shell comprises a second accommodating portion and a second covering portion, and the second accommodating portion is provided with a second accommodating cavity;

a second cavity opening is provided at a side wall of the second accommodating cavity, and the second covering portion is covered at the second cavity opening and is detachably connected to the first covering portion; and the battery is provided in the second accommodating cavity, the first display component is mounted at the second accommodating portion, and the second display component is mounted at the second covering portion.

25. The aerosol generating device according to claim 1, wherein:

the housing comprises an outer casing and a fixing member;

the outer casing comprises a top cover, a bottom cover, and a side cover;

a first end of the side cover is connected to the top cover, and a second end of the side cover is connected to the bottom cover;

the side cover is provided with a first light-transmitting area and a first guiding portion extending horizontally along the outer casing;

the top cover, the bottom cover, and the side cover together form a display window;

the fixing member is provided between the top cover and the bottom cover, and the fixing member is a fixing tube;

the fixing tube is provided with a second guiding portion, and the second guiding portion matches with the first guiding portion;

the first display component is installed at an outer surface of the fixing tube, and at least part of the first display component corresponds to a position of the display window; and the second display component is provided inside the outer casing, and at least part of the second display component corresponds to a position of the first light-transmitting area and a position of the display matching notch.

26. The aerosol generating device according to claim 25, wherein:

the side cover is provided with a first snap-fit portion;

the fixing tube is provided with a second snap-fit portion; and the first snap-fit portion is snap-fitted with the second snap-fit portion.

27. The aerosol generating device according to claim 26, wherein:

the fixing tube is provided with an avoidance hole, and the first snap-fit portion passes through the avoidance hole to snap-fit with the second snap-fit portion.

* * * * *